United States Patent
Yamazaki et al.

(10) Patent No.: US 8,415,231 B2
(45) Date of Patent: Apr. 9, 2013

(54) PHOTOVOLTAIC DEVICE AND METHOD FOR MANUFACTURING THE SAME

(75) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 51 days.

(21) Appl. No.: 13/213,636

(22) Filed: Aug. 19, 2011

(65) Prior Publication Data

US 2011/0306162 A1   Dec. 15, 2011

Related U.S. Application Data

(62) Division of application No. 12/076,690, filed on Mar. 21, 2008.

(30) Foreign Application Priority Data

Apr. 13, 2007   (JP) ................. 2007-106591

(51) Int. Cl.
*H01L 21/30* (2006.01)
*H01L 21/46* (2006.01)

(52) U.S. Cl.
USPC ..... 438/459; 438/458; 438/520; 257/E21.568

(58) Field of Classification Search .......... 438/458, 438/459, 520; 257/E21.568
See application file for complete search history.

(56) References Cited

U.S. PATENT DOCUMENTS

| | | | |
|---|---|---|---|
| 4,180,618 A | 12/1979 | Alpha et al. | |
| 4,633,034 A | 12/1986 | Nath et al. | |
| 4,665,277 A | 5/1987 | Sah et al. | |
| 5,259,891 A | 11/1993 | Matsuyama et al. | |
| 5,665,607 A | 9/1997 | Kawama et al. | |

(Continued)

FOREIGN PATENT DOCUMENTS

| | | |
|---|---|---|
| EP | 1 088 913 | 4/2001 |
| EP | 1 505 174 A | 2/2005 |

(Continued)

OTHER PUBLICATIONS

Invitation to Pay Additional Fees (International Application No. PCT/JP2008/055350) International Searching Authority, dated May 1, 2008.

(Continued)

*Primary Examiner* — David Vu
*Assistant Examiner* — Earl Taylor
(74) *Attorney, Agent, or Firm* — Eric J. Robinson; Robinson Intellectual Property Law Office, P.C.

(57) ABSTRACT

A photovoltaic device uses a single crystal or polycrystalline semiconductor layer which is separated from a single crystal or polycrystalline semiconductor substrate as a photoelectric conversion layer and has a SOI structure in which the semiconductor layer is bonded to a substrate having an insulating surface or an insulating substrate. A single crystal semiconductor layer which is a separated surface layer part of a single crystal semiconductor substrate and is transferred is used as a photoelectric conversion layer and includes an impurity semiconductor layer to which hydrogen or halogen is added on a light incidence surface or on an opposite surface. The semiconductor layer is fixed to a substrate having an insulating surface or an insulating substrate.

14 Claims, 21 Drawing Sheets

U.S. PATENT DOCUMENTS

| | | | |
|---|---|---|---|
| 5,811,348 A | 9/1998 | Matsushita et al. | |
| 6,271,101 B1 * | 8/2001 | Fukunaga | 438/455 |
| 6,331,208 B1 | 12/2001 | Nishida et al. | |
| 6,335,231 B1 * | 1/2002 | Yamazaki et al. | 438/151 |
| 6,344,404 B1 * | 2/2002 | Cheung et al. | 438/513 |
| 6,468,884 B2 | 10/2002 | Miyake et al. | |
| 6,468,923 B1 * | 10/2002 | Yonehara et al. | 438/761 |
| 6,486,041 B2 | 11/2002 | Henley et al. | |
| 6,534,380 B1 * | 3/2003 | Yamauchi et al. | 438/455 |
| 6,548,382 B1 * | 4/2003 | Henley et al. | 438/526 |
| 6,566,277 B1 | 5/2003 | Nakagawa et al. | |
| 6,602,761 B2 * | 8/2003 | Fukunaga | 438/459 |
| 6,692,981 B2 | 2/2004 | Takato et al. | |
| 6,803,264 B2 * | 10/2004 | Yamazaki et al. | 438/151 |
| 6,818,529 B2 | 11/2004 | Bachrach et al. | |
| 6,875,633 B2 * | 4/2005 | Fukunaga | 438/107 |
| 7,148,124 B1 * | 12/2006 | Usenko | 438/458 |
| 7,446,016 B2 * | 11/2008 | Endo et al. | 438/455 |
| 7,563,693 B2 * | 7/2009 | Fukushima et al. | 438/458 |
| 7,795,111 B2 * | 9/2010 | Shimomura et al. | 438/455 |
| 8,034,694 B2 * | 10/2011 | Ohnuma et al. | 438/458 |
| 8,044,296 B2 * | 10/2011 | Yamazaki et al. | 136/261 |
| 8,101,501 B2 * | 1/2012 | Ohnuma et al. | 438/458 |
| 8,153,508 B2 * | 4/2012 | Kim | 438/458 |
| 8,236,668 B2 * | 8/2012 | Ohnuma et al. | 438/458 |
| 2004/0056332 A1 | 3/2004 | Bachrach et al. | |
| 2005/0009252 A1 * | 1/2005 | Yamazaki et al. | 438/151 |
| 2005/0014859 A1 | 1/2005 | Iyama et al. | |
| 2005/0022864 A1 | 2/2005 | Fujioka et al. | |
| 2006/0065299 A1 | 3/2006 | Fukawa et al. | |
| 2006/0281280 A1 * | 12/2006 | Endo et al. | 438/455 |
| 2007/0173000 A1 * | 7/2007 | Yamazaki | 438/151 |
| 2007/0184632 A1 * | 8/2007 | Yamazaki et al. | 438/459 |
| 2007/0281440 A1 * | 12/2007 | Cites et al. | 438/458 |
| 2008/0160661 A1 | 7/2008 | Henley | |
| 2008/0245406 A1 | 10/2008 | Yamazaki et al. | |
| 2008/0246109 A1 * | 10/2008 | Ohnuma et al. | 257/507 |
| 2008/0251126 A1 * | 10/2008 | Yamazaki et al. | 136/261 |
| 2008/0261376 A1 * | 10/2008 | Yamazaki et al. | 438/406 |
| 2008/0268583 A1 * | 10/2008 | Yamazaki et al. | 438/151 |
| 2008/0318367 A1 * | 12/2008 | Shimomura et al. | 438/151 |
| 2009/0081849 A1 * | 3/2009 | Yamazaki et al. | 438/458 |
| 2011/0306162 A1 * | 12/2011 | Yamazaki et al. | 438/68 |

FOREIGN PATENT DOCUMENTS

| | | |
|---|---|---|
| JP | 01-227307 A | 9/1989 |
| JP | 07-226528 | 8/1995 |
| JP | 10-093122 | 4/1998 |
| JP | 10-335683 A | 12/1998 |
| JP | 2000-150940 | 5/2000 |
| JP | 2001-160540 | 6/2001 |
| JP | 2002-348198 | 12/2002 |
| JP | 2003-324188 A | 11/2003 |
| JP | 2004-014958 A | 1/2004 |
| JP | 2004-087667 A | 3/2004 |
| JP | 2005-050905 A | 2/2005 |
| JP | 2005-268682 | 9/2005 |

OTHER PUBLICATIONS

International Search Report (Application No. PCT/JP2008/055350) dated Jun. 24, 2008.

Written Opinion (Application No. PCT/JP2008/055350) dated Jun. 24, 2008.

* cited by examiner

CROSS-SECTIONAL VIEW ALONG LINE C-D

CROSS-SECTIONAL VIEW ALONG LINE E-F

CROSS-SECTIONAL VIEW ALONG LINE C-D

CROSS-SECTIONAL VIEW ALONG LINE E-F

CROSS-SECTIONAL VIEW ALONG LINE C-D

CROSS-SECTIONAL VIEW ALONG LINE E-F

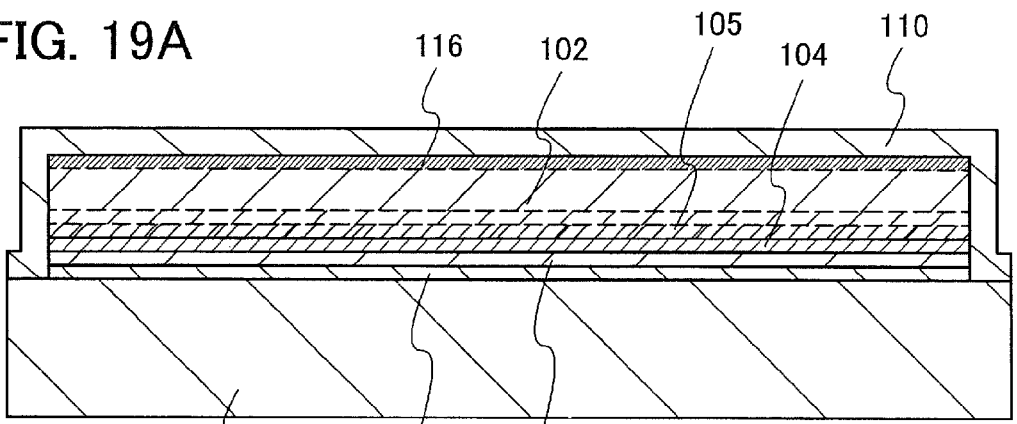
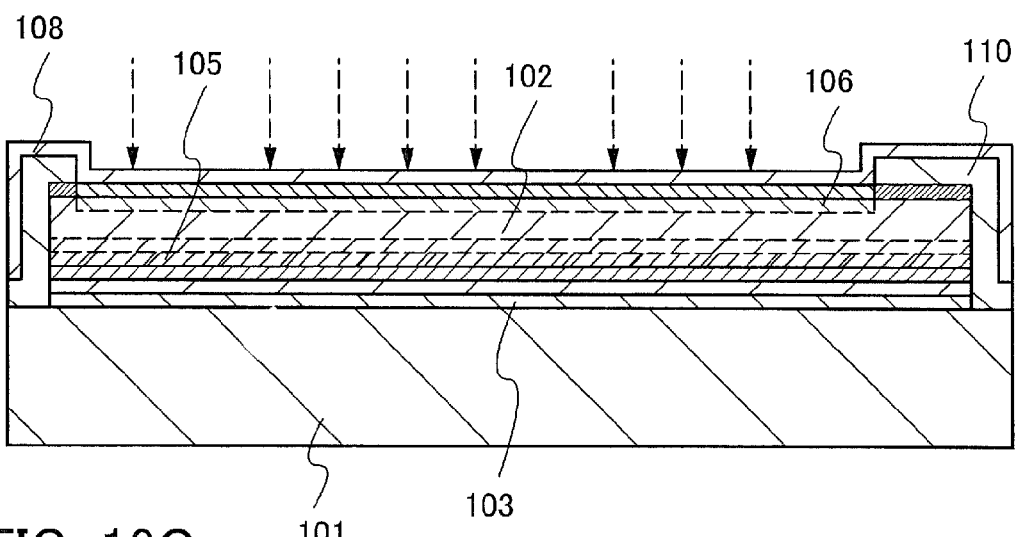
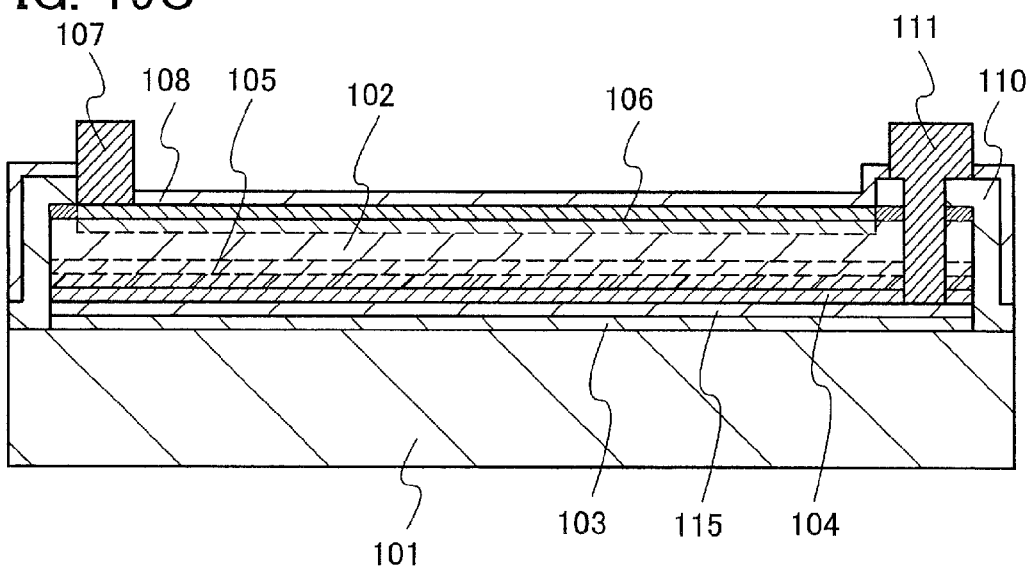

PHOTOVOLTAIC DEVICE AND METHOD FOR MANUFACTURING THE SAME

TECHNICAL FIELD

The present invention relates to crystal silicon photovoltaic devices and a method for manufacturing crystal silicon photovoltaic devices. The present invention generally relates to photovoltaic devices utilizing photoelectric conversion characteristics of crystalline semiconductors and a method for manufacturing the photovoltaic devices.

BACKGROUND ART

As a measure against global warming, solar photovoltaic systems are increasingly installed at many places. The total production of photovoltaic devices in the world in 2005 was 1,759 MW, which is an increase by 147% over the previous fiscal year. At present, the most popular photovoltaic device is crystal photovoltaic devices, and photovoltaic devices using single crystal silicon or polycrystalline silicon account for the large part of the production. A photovoltaic device which is called a crystal photovoltaic device uses a silicon wafer as a base, which is formed by forming a large silicon ingot and slicing the silicon ingot thin.

It is estimated that, in a crystal photovoltaic device using single crystal silicon or polycrystalline silicon, a thickness of a silicon wafer which is sufficient to generate photoelectromotive force is about 10 μm. However, a silicon wafer cut out from a silicon ingot has a thickness of about 200 μm to 500 μm. This means that only about 5% of a silicon wafer which is used in a photovoltaic device contributes to photoelectric conversion.

As production of photovoltaic devices increases, shortage in supply of silicon, which is a row material of silicon wafers and steep rise in price of silicon wafers become problems in industry. The production of polycrystalline silicon including those for semiconductors in the world in 2006 was about 37 thousand tons, and polycrystalline silicon which is demanded for solar sells is 11 thousand tons. Production of photovoltaic devices increases every year and the demand has already been tight. In order to increase production capacity of polycrystalline silicon, a large investment is needed and it is difficult to ensure the production which corresponds to the demand. Therefore, it is expected that shortage of silicon wafer supply will continue.

Here, as another type of a photovoltaic device using a single crystal semiconductor substrate, a photovoltaic device using a single crystal semiconductor layer which is thinned is given. For example, Patent Document 1 (Patent Document 1: Japanese Published Patent Application No. H10-335683) discloses a tandem solar cell in which hydrogen ions are implanted into a single crystal silicon substrate, and a single crystal silicon layer which is separated from the single crystal silicon substrate in a layer shape is disposed over a supporting substrate in order to lower the cost and save resources while maintaining high conversion efficiency. In this tandem solar cell, a single crystal semiconductor layer and a substrate are bonded to each other with a conductive paste.

Further, an attempt to directly form the crystal semiconductor layer over a substrate has been conventionally made. For example, a method for manufacturing a silicon thin film photovoltaic device in which crystal silicon film is deposited over a substrate by using a VHF which is higher than 27 MHz and pulse modulated (see Patent Document 2: Japanese Published Patent Application No. 2005-50905). Further, a technique for controlling plasma treatment conditions to optimize a concentration of a dopant in crystal grains and crystal grain boundaries when a thin film polycrystalline silicon film is formed by a plasma CVD method over a special electrode called a texture electrode which has minute unevenness on its surface (see Patent Document 3: Japanese Published Patent Application No. 2004-14958).

DISCLOSURE OF INVENTION

According to conventional art, a semiconductor substrate which is used for a crystal photovoltaic device is more than or equal to ten times as thick as the semiconductor substrate needed to be for photoelectric conversion and an expensive wafer is wasted. On the other hand, a crystal thin film silicon photovoltaic device is still inferior to a photovoltaic device using a semiconductor substrate in terms of photoelectric conversion characteristics because of low crystal quality. A crystal thin film silicon photovoltaic device has a problem in that a crystal silicon film needs to be formed by a chemical vapor deposition method to have a thickness of equal to or more than 1 μm and the productivity is low.

Further, in a method for bonding a thin slice of a single crystal semiconductor layer to a supporting substrate with a conductive paste, there is a problem such that bond strength cannot be maintained for a long time. In particular, in a condition in which a photovoltaic device is exposed to direct sunlight, there is a problem such that an organic material contained in a conductive paste is modified and bond strength is lowered. In addition, there is a problem of reliability such that a conductive material (e.g., silver) in the conductive paste is diffused into the single crystal semiconductor layer, which deteriorates photoelectric conversion characteristics of a semiconductor.

In view of the foregoing, it is an object to efficiently use silicon semiconductor materials which are necessary for photovoltaic devices. It is another object to improve productivity of photovoltaic devices and photoelectric conversion characteristics. It is yet another object to improve reliability of photovoltaic devices.

A photovoltaic device according to the present invention uses a single crystal semiconductor layer or a polycrystalline semiconductor layer which is separated from a single crystal semiconductor substrate or a polycrystalline semiconductor substrate and has a so-called SOI structure in which the semiconductor layer is bonded to a substrate having an insulating surface or an insulating substrate. The single crystal semiconductor layer or the polycrystalline semiconductor layer is a surface layer part of the single crystal semiconductor substrate or the polycrystalline semiconductor substrate which is separated and transferred from the semiconductor substrate. The single crystal semiconductor layer or the polycrystalline semiconductor layer is used as a photoelectric conversion layer and includes an impurity semiconductor layer to which hydrogen or halogen is added in a light incidence surface side and/or a side opposite to the light incidence surface.

The single crystal semiconductor layer or the polycrystalline semiconductor layer is separated from the single crystal semiconductor substrate or the polycrystalline semiconductor substrate by introduction of ions of hydrogen or halogen to the substrate and using a separation layer formed by introducing ions as a cleavage plane. The single crystal semiconductor layer or the polycrystalline semiconductor layer is fixed to a substrate having an insulating surface or an insulating substrate. One kind of ions or plural kinds of ions of different masses consisting of a single kind of atoms are preferably introduced into the single crystal semiconductor substrate or the polycrystalline semiconductor substrate. For example, in the case of introducing hydrogen ions, the hydrogen ions preferably include $H^+$, $H_2^+$, and $H_3^+$ ions with a high proportion of $H_3^+$ ions. By introducing ions with a large number of atoms into the single crystal semiconductor substrate or the polycrystalline semiconductor substrate, a dosage can be substantially increased and cleavage can be performed at low temperature along the layer formed by ion introduction (a separation layer) for forming a single crystal semiconductor layer or a polycrystalline semiconductor layer.

Either the single crystal semiconductor layer or the polycrystalline semiconductor layer and either the substrate having an insulating surface or the insulating substrate are fixed using a layer which has a smooth surface and forms a hydrophilic surface as a bonding surface. A bond is formed by Van der Waals force or a hydrogen bond, which utilizes interaction between molecules or atoms. Preferably, a bonding layer which is formed of silicon oxide with organic silane as a raw material is provided either or both of the surfaces which form a bond, when bonding the substrate and the single crystal semiconductor layer. As an organic silane gas, a silicon-containing compound such as tetraethoxysilane (TEOS) (chemical formula: $Si(OC_2H_5)_4$), trimethylsilane (TMS) (($CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like can be used. In other words, a layer which has a smooth surface and can form a hydrophilic surface is provided between the single crystal semiconductor layer or the polycrystalline semiconductor layer and the substrate having an insulating surface or the insulating substrate in order to provide a single crystal semiconductor.

Note that single crystals are crystals in which crystal faces and crystallographic axes are aligned and atoms or molecules which consist the single crystals are spatially ordered. However, although single crystals are structured by orderly aligned atoms, single crystals may include a lattice defect in which the alignment is disordered as a part or single crystals may include intended or unintended lattice strain.

By using a semiconductor layer which is separated from the single crystal semiconductor substrate or the polycrystalline semiconductor substrate as a photoelectric conversion layer, a photovoltaic device which is excellent in photoelectric conversion characteristics can be obtained. When the semiconductor layer includes an impurity semiconductor layer to which hydrogen or halogen is added in the light incidence side or the side opposite thereto, collection efficiency of photogenerated carriers is improved; therefore, photoelectric conversion characteristics can be improved. The semiconductor layer can be thinned while maintaining the thickness needed for photoelectric conversion through separation of the semiconductor layer from a single crystal semiconductor substrate or a polycrystalline semiconductor substrate and bonding of the separated semiconductor layer to a substrate having an insulating surface or an insulating substrate; therefore, the photoelectric conversion characteristics of the photovoltaic device can be improved. In addition, silicon resources can be saved.

By using a specific silicon oxide film as a bonding layer, a bond can be formed at a temperature equal to or lower than 700° C. Accordingly, even in the case of using a substrate with an upper temperature limit of equal to or lower than 700° C., such as a glass substrate, a single crystal semiconductor layer or a polycrystalline semiconductor layer with a bond portion having high bond strength can be provided over the substrate of glass or the like.

BRIEF DESCRIPTION OF DRAWINGS

FIGS. 19A to 19C are cross-sectional views illustrating manufacturing steps of a photovoltaic device relating to an embodiment mode;

BEST MODE FOR CARRYING OUT THE INVENTION

Embodiment Mode

Figure 1:
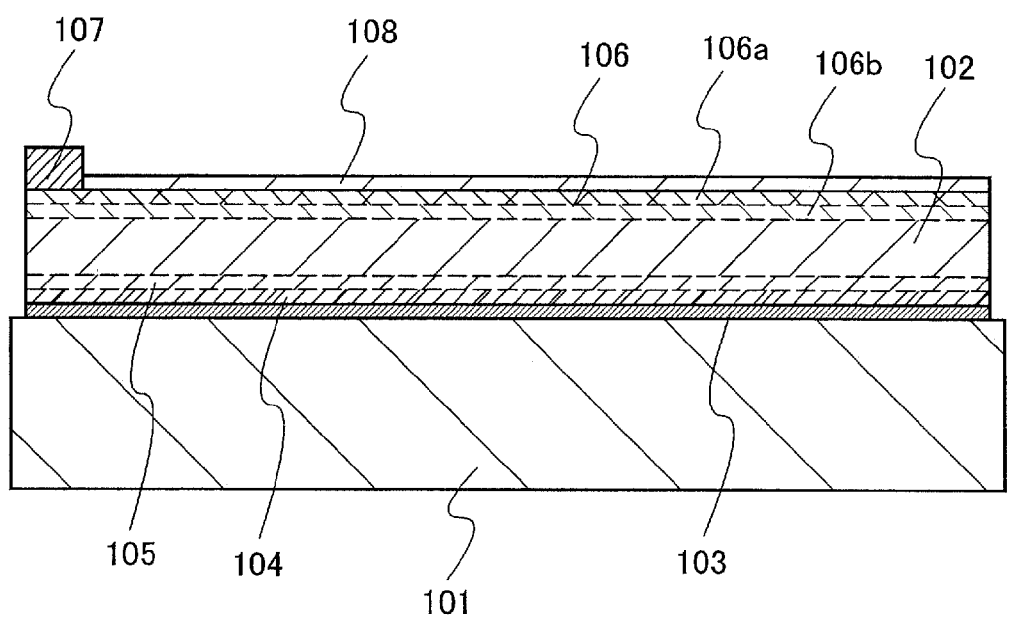
FIG. 1 is a diagram illustrating a cross-sectional structure of a photovoltaic device in which a single crystal semiconductor layer over an insulating substrate is used as a photoelectric conversion layer.

Hereinafter, embodiment modes of the present invention will be described with reference to the accompanying drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiment modes to be given below. Note that like portions in the drawings may be denoted by the like reference numerals in a structure of the present invention to be given below.

(Structure of a Photovoltaic Device)

FIG. 1 shows a cross-sectional structure of a photovoltaic device in which a semiconductor layer 102 is formed on a substrate 101. The substrate 101 is a substrate having an insulating surface or an insulating substrate, and any of a variety of glass substrates that are used in the electronics industry, such as an aluminosilicate glass substrate, an aluminoborosilicate glass substrate, and a barium borosilicate glass substrate, can be used. Alternatively, a ceramic substrate, a quartz glass substrate, or a semiconductor substrate such as a silicon wafer can be used. The semiconductor layer 102 is a crystal semiconductor and single crystal silicon is typically used. Alternatively, a crystal semiconductor of silicon, germanium or a compound semiconductor such as gallium arsenide or indium phosphide, which can be separated from a single crystal semiconductor substrate or a polycrystalline semiconductor substrate can be used.

A bonding layer 103 which has a flat surface and forms a hydrophilic surface is provided between the substrate 101 and the semiconductor layer 102. An insulating film is suitable for the bonding layer 103. For example, a silicon oxide film can be used. A silicon oxide film formed by a chemical vapor deposition method using an organic silane gas is preferably used as the bonding layer 103. Examples of an organic silane gas that can be used include a silicon-containing compound such as tetraethoxysilane (TEOS: $Si(OC_2H_5)_4$), trimethylsilane (TMS: $(CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

The bonding layer 103 which has a smooth surface and forms a hydrophilic surface is provided to have a thickness of 5 to 500 nm. When the thickness of the bonding layer 103 is within that range, unevenness of a surface on which the bonding layer 103 is formed is not reflected and a surface of the bonding layer 103 can be planarized. In addition, distortion due to stress between the bonding layer 103 and the substrate to which the bonding layer 103 is bonded can be relieved.

The bonding layer 103 is provided on the semiconductor layer 102 and is disposed in close contact with a surface of the substrate 101, so that bonding can be performed even at room temperature. In order to bond the substrate 101 and the bonding layer 103, which are formed from different kinds of materials at low temperature, surfaces thereof are cleaned. When the substrate 101 and the bonding layer 103 having cleaned surfaces are disposed in close contact with each other, a bond is formed by attraction between the surfaces. In this case, it is preferable to perform treatment in which a hydroxy group is attached to a surface of either one or both surfaces of the substrate 101 and the bonding layer 103, which is to form a bond. Oxygen plasma treatment or ozone treatment can made the surface of the substrate 101 hydrophilic. It is considered that this phenomenon occurs because a surface which is subjected to oxygen plasma treatment or ozone treatment is activated and a hydroxy group is attached. That is, in the case of performing treatment in which the surface of the substrate 101 is made hydrophilic, a bond is formed due to hydrogen bonding by action of a hydroxy group on the surface. To increase strength of a bond formed at room temperature, thermal treatment is preferably performed.

As treatment for bonding the substrate 101 and the bonding layer 103 to each other at low temperature, a surface which is to form a bond may be cleaned by being irradiated with an ion beam using a rare gas such as argon. By irradiation with an ion beam, dangling bonds are exposed on the surface of the substrate 101 or the bonding layer 103 and the surface is extremely activated. When surfaces which are thusly activated are disposed in close contact with each other, a bond can be formed even at low temperature. A method for forming a bond by activation of the surfaces is preferably carried out in vacuum because the surfaces need to be highly cleaned.

When the substrate 101 and the semiconductor layer 102 are pressed, a strong bond can be formed. Further, when thermal treatment is performed on the substrate 101 and the semiconductor layer 102 which are superposed on each other, bond strength can be increased. The thermal treatment is performed at 300 to 700° C. using a rapid thermal annealing (RTA) apparatus. By emitting laser light towards the semiconductor layer 102 from the substrate 101 side, bond strength can be increased. Such treatment may be performed under pressure.

The semiconductor layer 102 is formed by separating a thin slice from a single crystal semiconductor substrate. For example, the semiconductor layer 102 is formed by introducing ions of hydrogen into a predetermined depth of a single crystal semiconductor substrate at high concentration, performing thermal treatment, and separating a single crystal silicon layer which is an outer layer of the single crystal semiconductor substrate. Ions of halogen typified by fluorine can be employed instead of hydrogen as ions to be introduced into the single crystal semiconductor substrate. Hydrogen may be introduced after introduction of halogen, or halogen may be introduced after introduction of hydrogen. In addition, ions of a rare gas such as helium, argon, or krypton may be introduced before or after this step. A thickness of the semiconductor layer 102 is 0.1 to 10 μm. This thickness of the semiconductor layer 102 is sufficient for absorption of sunlight. In addition, this thickness is suitable for extracting photogenerated carriers, which flow in the semiconductor layer 102, through an electrode before the photogenerated carriers are eliminated by recombination.

In this case, one kind of ions or plural kinds of ions of different masses consisting of a single kind of atoms are preferably introduced into the single crystal semiconductor substrate. For example, in the case of introducing hydrogen ions into the single crystal semiconductor substrate, the hydrogen ions preferably include $H^+$, $H_2^+$, and $H_3^+$ ions with a high proportion of $H_3^+$ ions. When ions having a large number of atoms are introduced, the single crystal semiconductor substrate can be irradiated with a larger number of ions; therefore, time for ion introduction can be shortened.

Ions can be introduced into the single crystal semiconductor substrate by an ion implantation method or an ion doping method. An ion implantation method refers to a method by which an ionized gas which has been subjected to mass separation is implanted into a semiconductor. In this ion implantation method, $H_3^+$ can be selectively introduced, for example. An ion doping method refers to a method by which an ionized gas which is not subjected to mass separation is accelerated by an electrical field and introduced into a substrate. With this ion doping method, ion doping of a large dose can be performed with high efficiency even on a large-area substrate.

As another method for obtaining the semiconductor layer 102, a method may be employed in which after single crystal silicon is epitaxially grown over porous silicon, a porous silicon layer is separated by cleavage by water-jetting.

A first electrode 104 is provided between the semiconductor layer 102 and the bonding layer 103. The first electrode 104 is formed using metal such as aluminum, nickel, or silver. In the case where a light incidence surface is on the substrate 101 side, the first electrode 104 may be formed of a transparent electrode of indium tin oxide or the like. A first impurity semiconductor layer 105 is preferably formed in a part which is on a side of the semiconductor layer 102 which is in contact with the first electrode 104. In the case where the semiconductor layer 102 has p-type conductivity, the first impurity semiconductor layer 105 is doped with an element belonging to Group 13 in the periodic table, such as boron, so that the impurity concentration thereof is heightened and the first impurity semiconductor layer 105 has $p^+$ type conductivity. In the case where light is incident on the semiconductor layer 102 side, the first impurity semiconductor layer 105 is opposite to the light incidence surface and the first impurity semiconductor layer 105 forms an internal electric field, which is also referred to as a back surface field (BSF). A structure with BSF is suitable for improving external quantum efficiency of photogenerated carriers. Such a structure effectively functions in a photovoltaic device in which a photoelectric conversion layer is formed of the semiconductor layer 102 with a thickness of 0.1 to 10 μm. Note that the first impurity semiconductor layer 105 can be omitted. When a second impurity semiconductor layer 106 which is described later is provided, the photovoltaic device can function.

The semiconductor layer 102 includes the second impurity semiconductor layer 106 in a part which is on the side opposite to the first impurity semiconductor layer 105. The second impurity semiconductor layer 106 are formed to have an opposite conductivity type to that of the first impurity semiconductor layer 105. For example, in the case where the first impurity semiconductor layer 105 has p-type conductivity, the second impurity semiconductor layer 106 is a layer having n-type conductivity. As an n-type impurity, an element belonging to Group 15 in the periodic table, such as phosphorus or arsenic is used. The impurity element can be added either by an ion implantation method or an ion doping method.

The second impurity semiconductor layer 106 includes a wide band-gap layer 106a which includes hydrogen or halogen typified by fluorine as well as an n-type or p-type impurity. Hydrogen or halogen typified by fluorine may be distributed over the entire part of the second impurity semiconductor layer 106; however, they are preferably distributed so that the concentration thereof is high near the surface of the semiconductor layer 106. In any case, the concentration of hydrogen or halogen in the second impurity semiconductor layer 106 is preferably higher than that in the center region of the semiconductor layer 102, in distribution in the thickness direction of the semiconductor layer 102. FIG. 1 shows a region in a surface layer of the second impurity semiconductor layer 106 in which hydrogen or halogen is distributed at high concentration as the wide band-gap layer 106a. Apparently, distribution of hydrogen or halogen in the second impurity semiconductor layer 106 is not limited thereto and hydrogen or halogen may be distributed over the entire part of the second impurity semiconductor layer 106. Since defects serving as carrier traps are generated near an impurity semiconductor layer to which an impurity element is added, it is effective to make halogen contained to compensate the defect in order to improve conversion efficiency.

The wide band-gap layer 106a which includes hydrogen or halogen typified by fluorine at higher concentration than another region is provided on a surface side in the second impurity semiconductor layer 106 in the semiconductor layer 102; therefore, an energy gap of the region widened. When the energy gap in the wide band-gap layer 106a is widened, more light enters the semiconductor layer 102 which is suitable for photoelectric conversion, in the case where a light incidence surface is on the wide band-gap layer 106a side; accordingly, conversion efficiency can be increased.

A second electrode 107 is provided over the second impurity semiconductor layer 106. In the case where a light incidence surface is on the second impurity semiconductor layer 106 side, the second electrode 107 is formed of an electrode which is formed of aluminum, silver, or the like and shaped into a comb shape, or the second electrode 107 is formed of a transparent electrode of indium tin oxide or the like. In this structure, a protection film 108 is preferably formed over the second impurity semiconductor layer 106. The protection film 108 is preferably formed of a silicon nitride film. The protection film 108 may also include films having different refractive indexes which are stacked so as to function as an anti-reflective film. For example, a stacked-layers structure having a silicon nitride film and a magnesium fluoride film is employed as a structure of an anti-reflective film. In the case where a light incidence surface is on the substrate 101 side, the second electrode 107 may be formed from metal such as aluminum.

Figure 2:
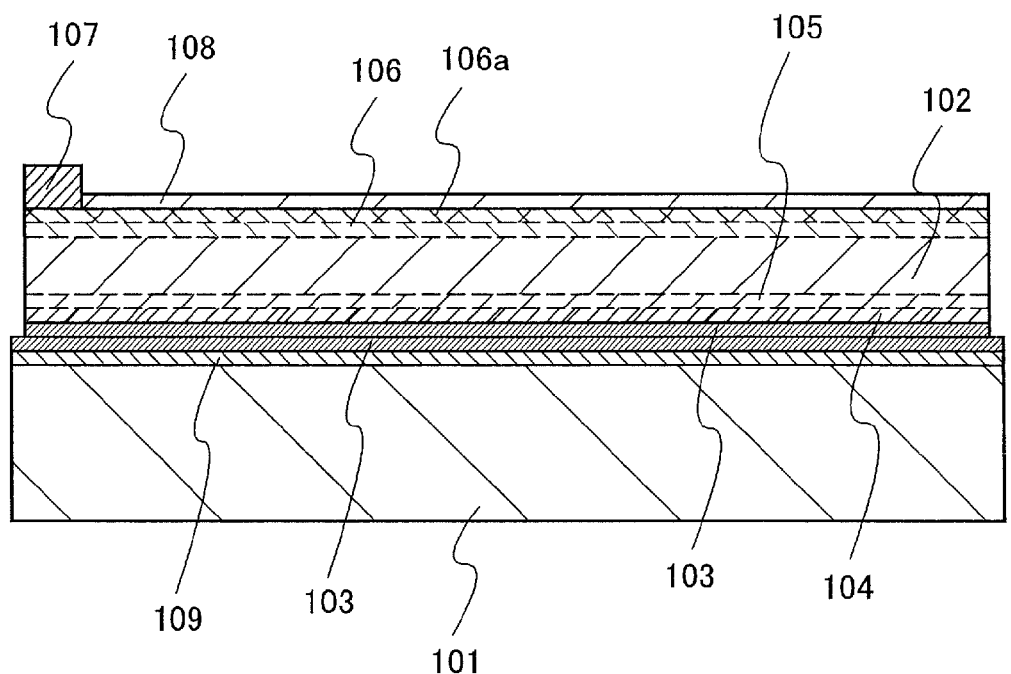
FIG. 2 is a diagram illustrating a cross-sectional structure of a photovoltaic device in which a single crystal semiconductor layer over an insulating substrate is used as a photoelectric conversion layer.

FIG. 2 shows a structure in which the substrate 101 is provided with a barrier layer 109 and the bonding layer 103. When the barrier layer 109 is provided, the semiconductor layer 102 can be prevented from being contaminated. That is, an impurity such as a movable ion like an alkali metal or an alkaline earth metal can be prevented from diffusing from the substrate 101 into the semiconductor layer 102. The barrier layer 109 is preferably a dense insulating film of silicon nitride, aluminum nitride, or the like. In this case, the bonding layer 103 is preferably provided over the barrier layer 109 which is over the substrate 101. When the bonding layer 103 is also provided on the substrate 101 side, a dense insulating film of silicon nitride or the like can be employed as the barrier layer 109 and a favorable bond with the semiconductor layer 102 can be formed. Note that other elements are similar to those in FIG. 1.

Figure 3:
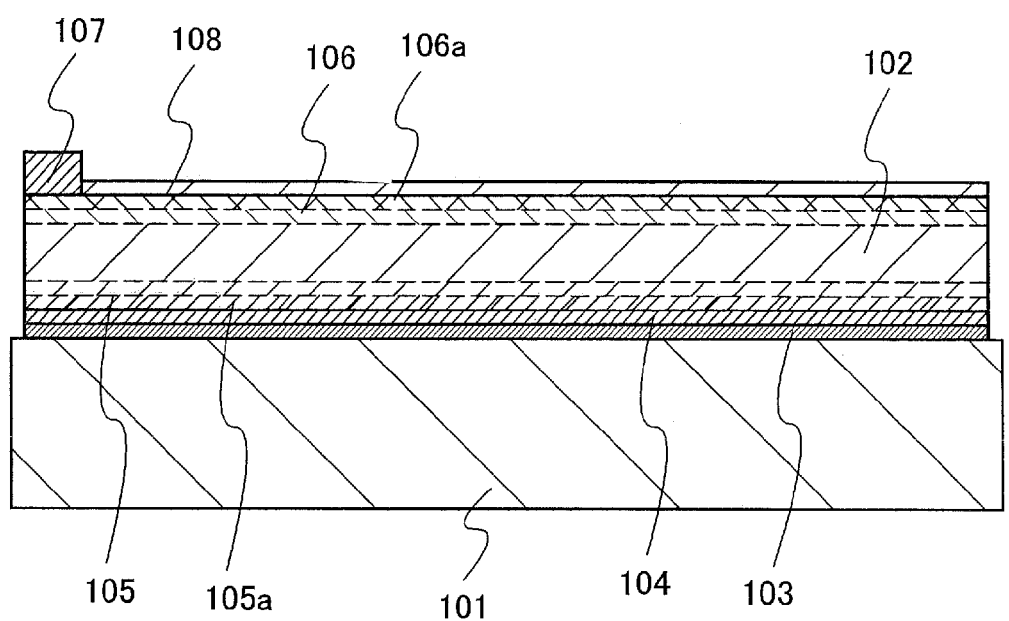
FIG. 3 is a diagram illustrating a cross-sectional structure of a photovoltaic device in which a single crystal semiconductor layer over an insulating substrate is used as a photoelectric conversion layer.

FIG. 3 shows a structure in which the first impurity semiconductor layer 105 in the semiconductor layer 102 includes hydrogen or halogen typified by fluorine. Hydrogen or halogen typified by fluorine may be distributed over the entire part of the first impurity semiconductor layer 105. The first impurity semiconductor layer 105 includes a wide band-gap layer 105a which includes hydrogen or halogen typified by fluorine as well as an n-type or p-type impurity. Hydrogen or halogen typified by fluorine in the wide band-gap layer 105a is preferably distributed so that the concentration thereof on the first electrode 104 side is high. FIG. 3 shows a mode in which the wide band-gap layer 105a which includes hydrogen or halogen at high concentration is formed on the first electrode 104 side in the first impurity semiconductor layer 105, but the present invention is not limited thereto. Hydrogen or halogen may be distributed over the entire part of the second impurity semiconductor layer 106. By increasing the concentration of hydrogen or halogen typified by fluorine in the first impurity semiconductor layer 105, an energy gap of the wide band-gap layer 105a is widened. When the energy gap of the first impurity semiconductor layer 105 is widened, a back surface field (BSF) can be stronger and collection efficiency of photogenerated carriers can be improved. In addition, since a built-in potential (a built-in electric field) is also increased, the photoelectric conversion characteristics can be improved as a result. In any case, the concentration of hydrogen or halogen in the first impurity semiconductor layer 105a and the second impurity semiconductor layer 106 is preferably higher than that in the center region of the semiconductor layer 102 in distribution in the thickness direction of the semiconductor layer 102. Note that other elements are similar to those in FIG. 1.

The structures of a photovoltaic device using the semiconductor layer 102 bonded to the substrate 101 have been described with reference to FIGS. 1 to 3, but this embodiment mode is not limited to this and can be implemented by freely combining elements in different structures. Further, a polycrystalline semiconductor layer can be used instead of a single crystal semiconductor layer.

Embodiment Mode 1

A method for manufacturing a photovoltaic device, in which a thin single crystal semiconductor layer is separated from a single crystal semiconductor substrate and the separated single crystal semiconductor layer is transferred to a substrate having an insulating surface or an insulating substrate, is described with reference to the drawings.

Figure 4:
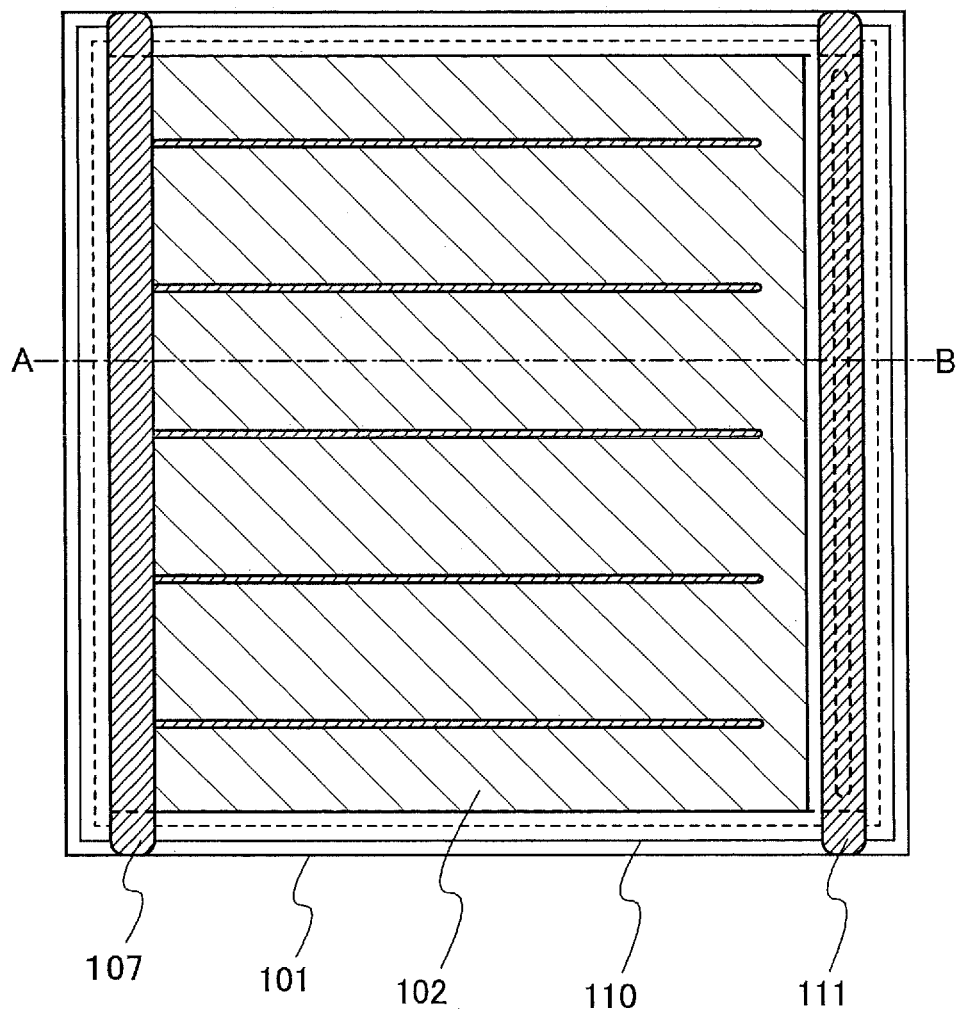
FIG. 4 is a plan view illustrating a photovoltaic device relating to an embodiment mode.

FIG. 4 is a plan view of a photovoltaic device relating to this embodiment mode. This photovoltaic device has a structure in which light is incident on the semiconductor layer 102 side provided over the substrate 101. In a peripheral portion of the substrate 101, an insulating layer 110 having an opening is provided over the semiconductor layer 102. The second electrode 107 having a comb shape is formed over the semiconductor layer 102. An extraction electrode 111 which is on a side opposite to the second electrode 107 is electrically connected to a first electrode through a contact hole penetrating the insulating layer 110 and the semiconductor layer 102.

Next, manufacturing steps of the photovoltaic device are described with reference to cross-sectional views corresponding to line A-B in FIG. 4.

Figure 5A:
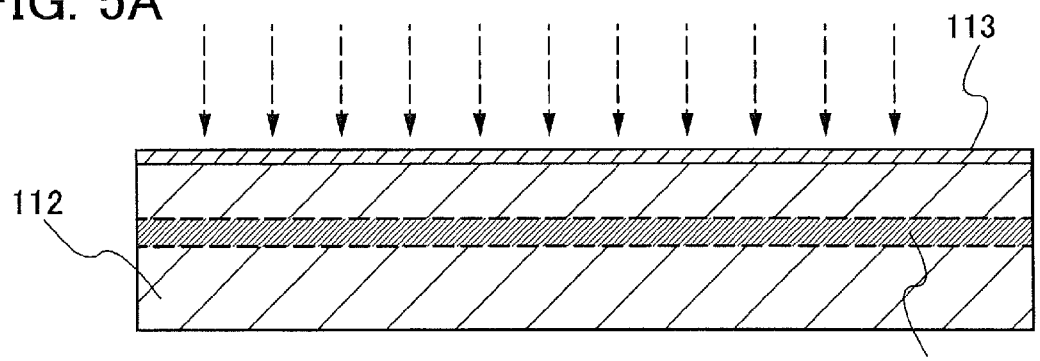
FIGS. 5A to 5D are cross-sectional views illustrating manufacturing steps of a photovoltaic device relating to an embodiment mode.

As shown in FIG. 5A, a surface protection film 113 is formed on a surface of a single crystal semiconductor substrate 112. A typical example of the single crystal semiconductor substrate 112 is single crystal silicon, and a silicon wafer having a mirror-polished surface is suitable. The surface protection film 113 is preferably formed of silicon oxide or silicon nitride by a chemical vapor deposition method. A plasma chemical vapor deposition (CVD) method is typically employed as a chemical vapor deposition method. The surface protection film 113 is preferably provided in order to protect a surface of the single crystal semiconductor substrate 112 from being roughened by ion introduction. The surface protection film 113 is preferably provided to have a thickness of 50 to 200 nm. Ions accelerated by an electric field is introduced through the surface of the surface protection film 113, so that the separation layer 114 is formed at a predetermined depth of the single crystal semiconductor substrate 112.

Ion introduction is performed in consideration of a thickness of a semiconductor layer that is to be transferred to a substrate. The thickness of the semiconductor layer is about 0.1 to 10 μm. In order to form the separation layer 114 at a comparatively large distance from the surface of the single crystal semiconductor substrate 112, ions are accelerated by high voltage of 80 kV or more and introduced. Ions are preferably incident on a principal surface of the single crystal semiconductor substrate 112 at approximately right angle, and a channeling effect may be positively utilized. For example, a crystal plane orientation of the single crystal semiconductor substrate 112 may be selected so that ions are perpendicularly incident on the crystal axis <100>. Further, the depth which introduced ions reach may be controlled by tilting the substrate. The region over the separation layer 114 is the semiconductor layer 102.

The separation layer 114 is formed by introducing ions of hydrogen or halogen typified by fluorine. Ions of a rare gas such as helium, argon, or krypton may also be introduced. Ions are introduced either by an ion implantation method or an ion doping method. In the case of forming the separation layer 114 in the single crystal semiconductor substrate 112, one kind of ions or plural kinds of ions of different masses consisting of a single kind of atoms are preferably introduced. In the case of introducing hydrogen ions, the hydrogen ions preferably include $H^+$, $H_2^+$, and $H_3^+$ ions with a high proportion of $H_3^+$ ions because time for ion introduction can be shortened. By introducing hydrogen ions with a large number of atoms, dangling bonds of silicon are formed in the separation layer 114 and the dangling bonds are terminated to form minute voids (microvoids).

The separation layer 114 may be formed by introducing ion species of a rare gas to the single crystal semiconductor substrate 112 to form dangling bonds in a region where the ion species are introduced, and introducing hydrogen so that the dangling bonds and hydrogen are bonded. In this method, it is preferable to introduce hydrogen ions with a large mass so that hydrogen and silicon in the single crystal semiconductor substrate 112 form not only Si—H bonds but also Si—$H_2$ bonds at high proportion. Since Si—$H_2$ bonds start releasing hydrogen at low temperature compared to Si—H bonds, separation of the semiconductor layer 102 can be performed at lower temperature. At any rate, minute voids fanned due to introduction of ions can have unbound hydrogen between silicon crystal lattices; therefore, the semiconductor layer 102 can be easily separated with thermal treatment at low temperature.

Figure 5B:
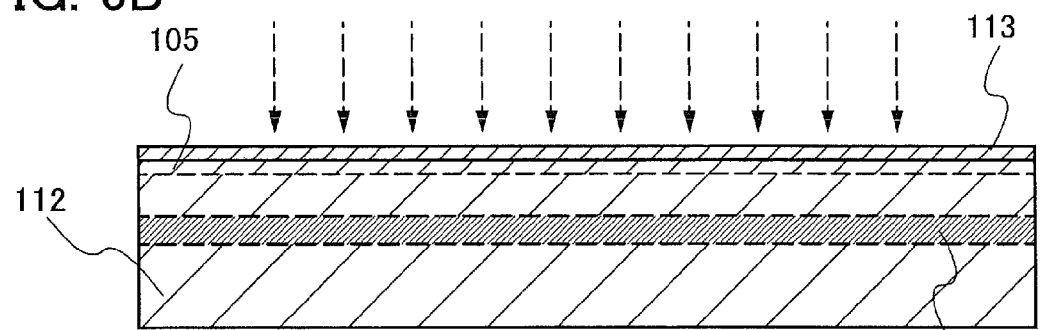

Then, as shown in FIG. 5B, a thin region on the surface in the single crystal semiconductor substrate 112 is doped with boron, which is an impurity element imparting p-type conductivity so that the first impurity semiconductor layer 105 is formed. In the photovoltaic device of this embodiment mode, the first impurity semiconductor layer 105 is disposed on the side opposite to the light incidence surface side so that a back surface field (B SF) is formed.

Figure 6:
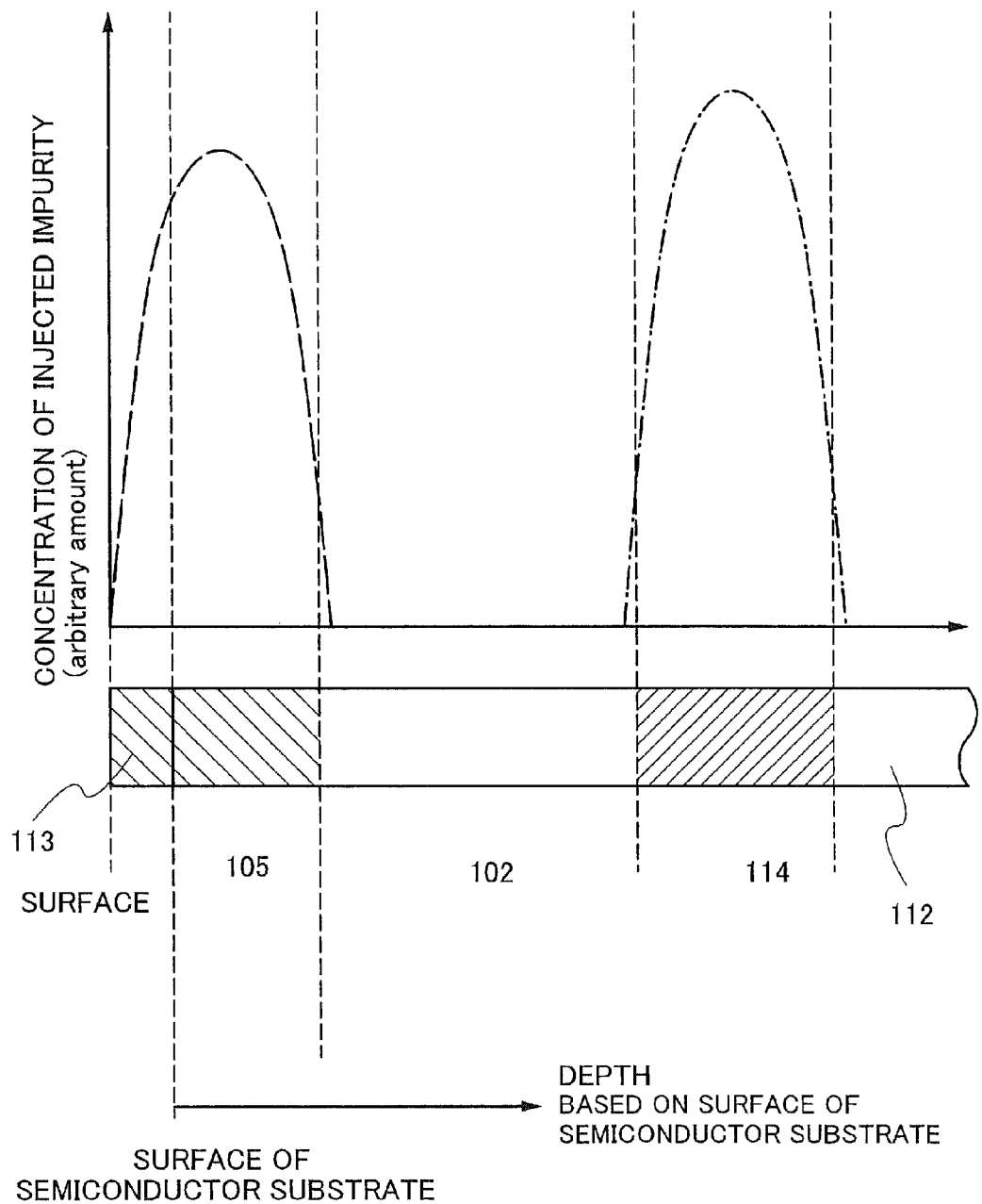
FIG. 6 is a graph illustrating an impurity distribution in a separation layer and a first impurity semiconductor layer which are formed in a single crystal semiconductor substrate.

FIG. 6 shows distribution of an introduced impurity in the separation layer 114 and the first impurity semiconductor layer 105, which are formed in the single crystal semiconductor substrate 112. The separation layer 114 is formed at a long distance from the surface of the single crystal semiconductor substrate 112 (the region which is denoted by a long dashed short dashed line), where a concentration of hydrogen or halogen such as fluorine which are distributed is higher than that in other regions. The first impurity semiconductor layer 105 is formed in a region on a surface side in the single crystal semiconductor substrate 112 (the region which is denoted by a dashed line), where a concentration of boron, which is an impurity element imparting p-type conductivity which is distributed is higher than that in other regions.

Figure 5C:
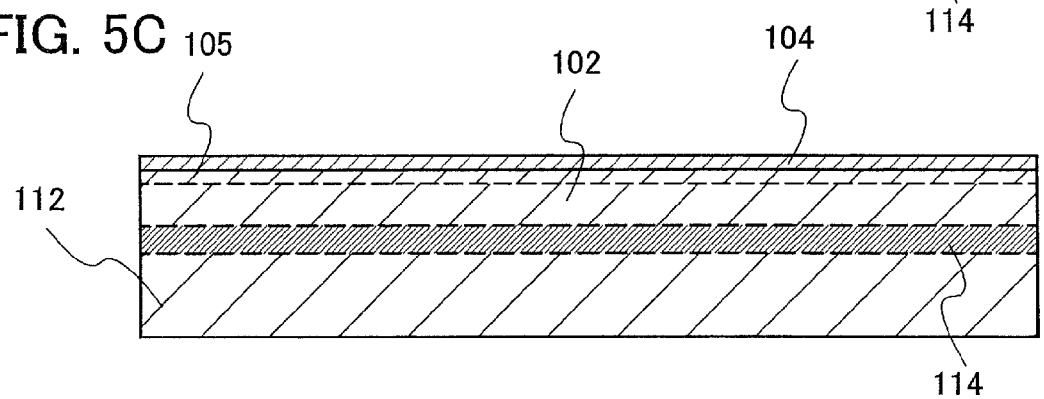

FIG. 5C shows a step of forming the first electrode 104 over the first impurity semiconductor layer 105. The first electrode 104 is formed from metal such as aluminum, nickel, or silver. The first electrode 104 is formed by a vacuum deposition method or a sputtering method so that a surface thereof is planarized.

Figure 5D:
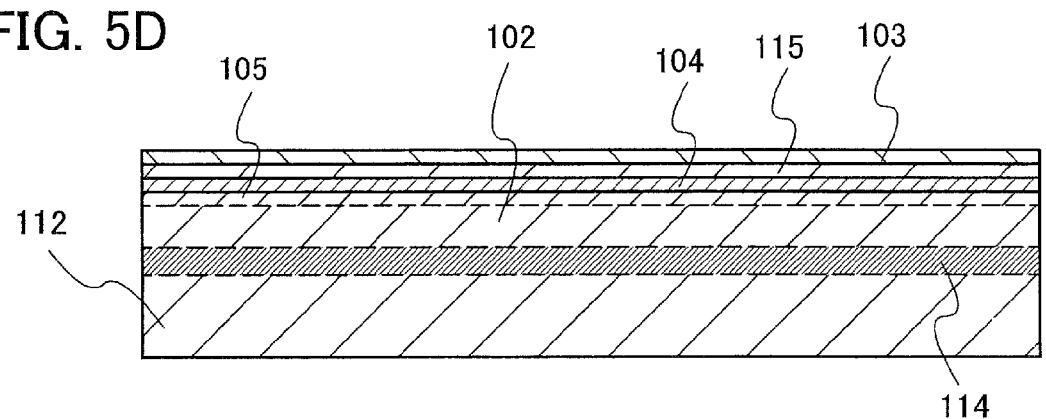

FIG. 5D shows a step in which a protection film 115 which covers the single crystal semiconductor substrate 112 is provided over the first electrode 104 and the bonding layer 103 is further formed. The protection film 115 is preferably formed of a silicon nitride film in order to prevent impurity contamination. The protection film 115 can prevent the semiconductor layer 102 from being contaminated by diffusion of an impurity such as a movable ion or moisture. In addition, the protection film 115 can prevent oxidation of the first electrode 104 in formation of the bonding layer 103. The bonding layer 103 is preferably formed of a silicon oxide film. As a silicon oxide film, a silicon oxide film which is formed using an organic silane gas by a chemical vapor deposition method is preferably used as described above. Alternatively, a silicon oxide film which is formed by a chemical vapor deposition method using a silane gas can be used. Film formation by a chemical vapor deposition method is performed at a film formation temperature of, for example, equal to or lower than 350° C., which is a temperature at which degassing does not occur in the separation layer 114 formed in the single crystal semiconductor substrate. In contrast, thermal treatment with which the semiconductor layer 102 is separated from the single crystal semiconductor substrate 112 is performed at a thermal treatment temperature higher than the film formation temperature.

Figure 7A:
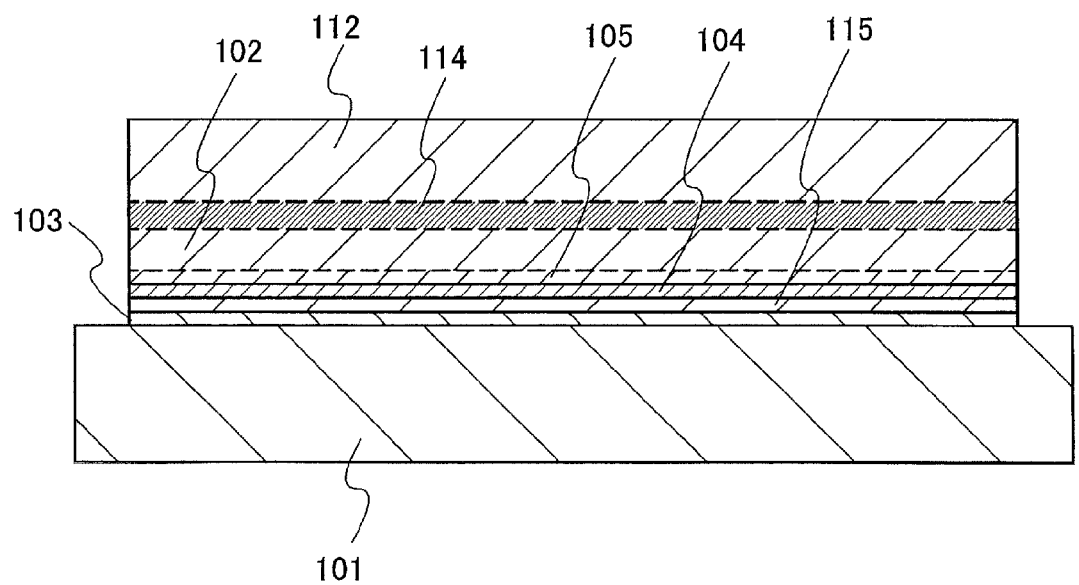
FIGS. 7A and 7B are cross-sectional views illustrating manufacturing steps of a photovoltaic device relating to an embodiment mode.

FIG. 7A shows a step in which the substrate 101 is disposed in close contact with a surface of the bonding layer 103 which is provided for the single crystal semiconductor substrate 112, to bond the two to each other. Surfaces which are to form a bond is cleaned sufficiently. Then, the substrate 101 and the bonding layer 103 are disposed in close contact with each other, whereby a bond is formed therebetween. This bond is formed by action of hydrogen bonding as described above. By pressing the substrate 101 and the single crystal semiconductor substrate 112 against each other, a bond can be formed further reliably.

In order to form a favorable bond, either one or both surfaces of the substrate 101 and the bonding layer 103 may be activated. For example, either one or both surfaces of the substrate 101 and the bonding layer 103 can be activated by irradiating the surface which is to form a bond with an atomic beam or an ion beam. When an atomic beam or an ion beam is used, a rare gas neutral atom beam or a rare gas ion beam of argon or the like can be used. Alternatively, plasma irradiation or radical treatment may be performed on a surface which is to form a bond. Such surface treatment facilitates formation of a bond between different kinds of materials even at a temperature of 200 to 400° C.

After the substrate 101 and the single crystal semiconductor substrate 112 are bonded to each other with the bonding layer 103 interposed therebetween, it is preferable that heat treatment or pressure treatment be performed. Heat treatment or pressure treatment makes it possible to increase bond strength. The thermal treatment is preferably performed at a temperature equal to or lower than the upper temperature limit of the substrate 101. The pressure treatment is performed so that pressure is applied in a direction perpendicular to the bonding surface, in consideration of the pressure resistance of the substrate 101 and the single crystal semiconductor substrate 112. A halogen lamp or the like may be used for heating. Laser light irradiation may be performed for increasing bond strength at low temperature. A wavelength of laser light which is used for irradiation is preferably in the range from visible light wavelength to ultraviolet wavelength. For example, excimer laser light irradiation may be performed, or an excimer lamp may be used as a means for ultraviolet irradiation in order to increase bond strength. At any rate, ultraviolet light irradiation can encourage reaction on a bonding portion and increase bond strength.

Figure 7B:
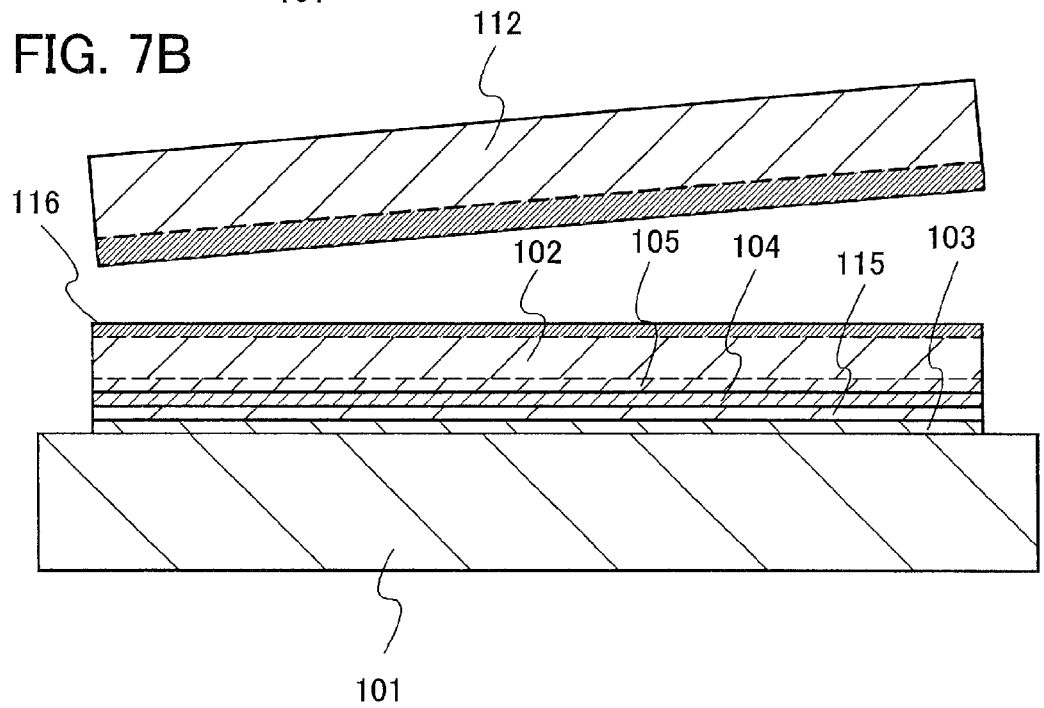

In FIG. 7B, after the substrate 101 and the single crystal semiconductor substrate 112 are bonded to each other, thermal treatment is performed to separate the single crystal semiconductor substrate 112 from the substrate 101 using the separation layer 114 as a cleavage plane. The thermal treatment is preferably performed at a temperature ranging from a temperature at which the bonding layer 103 is formed to the upper temperature limit of the substrate 101. When the thermal treatment is performed at, for example, 400 to 600° C., a change occurs in volume of minute voids formed in the separation layer 114, which enables separation of the single crystal semiconductor substrate 112 from the substrate 101 with the semiconductor layer 102 left over the substrate 101. A wide band-gap layer 116 including hydrogen or halogen such as fluorine introduced in order to form the separation layer 114 is left on the surface side in the semiconductor layer 102. The wide band-gap layer 116 is a layer in which an energy gap is larger than 1.12 eV, which is an energy gap of silicon, because the wide band-gap layer 116 includes hydrogen or halogen in silicon of the single crystal semiconductor substrate 112. Since bond energy of Si—H or Si—F is larger than that of Si—Si, the wide band-gap layer 116 inevitably has a wider band gap. The surface of the semiconductor layer 102 which is separated has minute unevenness. The unevenness may be left. It is expected that minute unevenness suppress light reflection. In the case of planarizing the surface of the semiconductor layer 102, the surface may be polished by a chemical mechanical polishing (CMP) method.

Figure 8A:
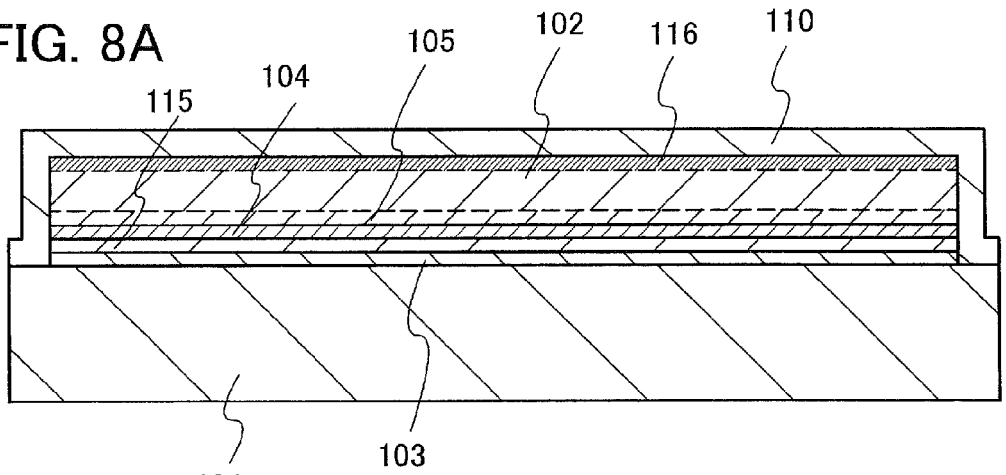
FIGS. 8A to 8C are cross-sectional views illustrating manufacturing steps of a photovoltaic device relating to an embodiment mode.

FIG. 8A shows a step in which the insulating layer 110 is formed over the semiconductor layer 102 which is bonded to the substrate 101. As the insulating layer 110, a silicon nitride film or a silicon oxide film is preferably formed by a chemical vapor deposition method.

Figure 8B:
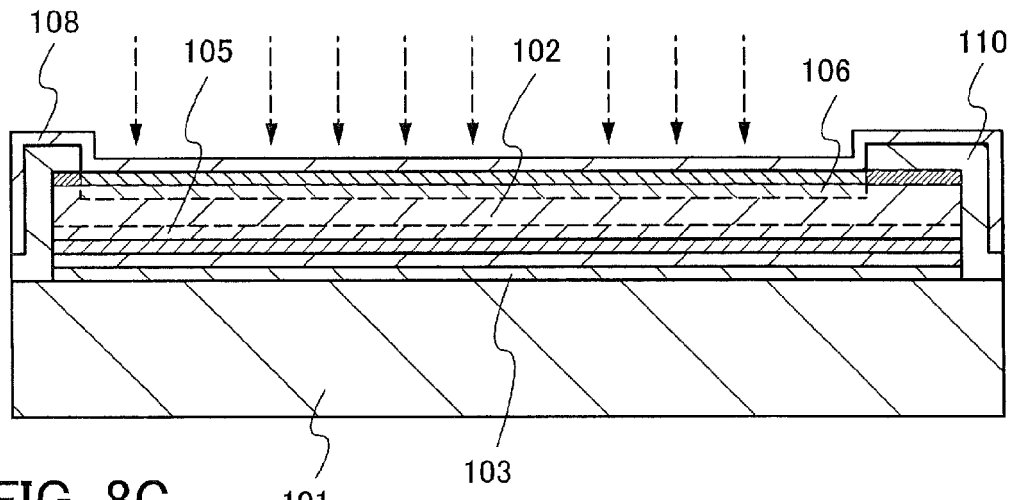

FIG. 8B shows a step in which an opening is formed in the insulating layer 110 and phosphorus or arsenic, which is an n-type impurity element, is added through the opening to form the second impurity semiconductor layer 106. The second impurity semiconductor layer 106 is used as a light incidence surface. In this case, the second impurity semiconductor layer 106 is formed to include a wide band-gap layer 116. The wide band-gap layer 116 is a layer which includes an n-type impurity element as well as hydrogen or halogen such as fluorine. It is possible that the second impurity semiconductor layer 106 be formed to include the wide band-gap layer 116 as the entire part. Further, the second impurity semiconductor layer 106 may be formed deeper than the wide band-gap layer 116. In this case, hydrogen in the wide band-gap layer 116 can be prevented from being released by forming a silicon nitride film as the protection film 108 on the surface of the semiconductor layer 102 and then introducing an n-type impurity element such as phosphorus or arsenic.

Figure 9:
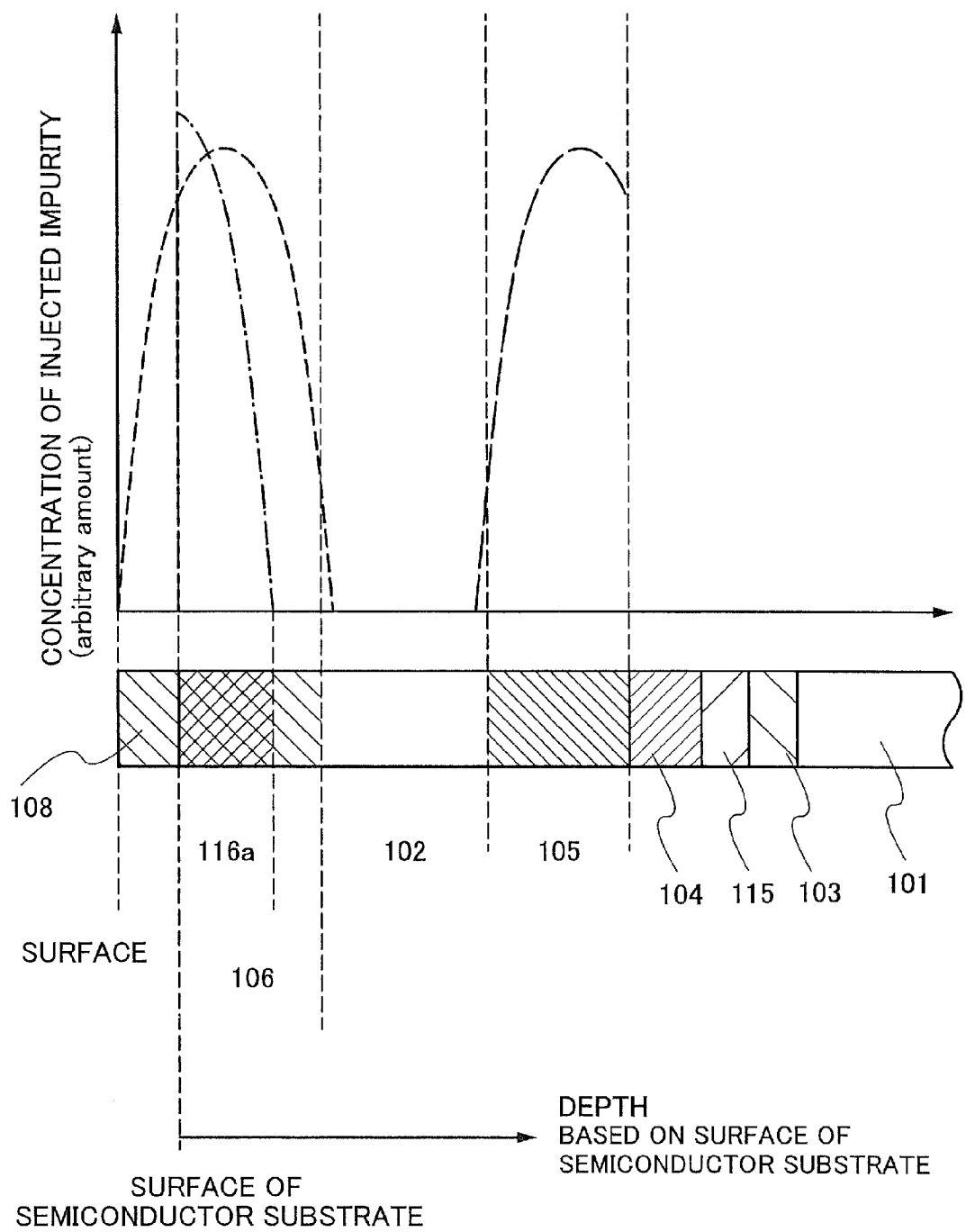
FIG. 9 is a graph illustrating a relation of a first impurity semiconductor layer, a second impurity semiconductor layer, and a wide band-gap layer which are formed in a semiconductor layer.

FIG. 9 is a graph showing a relation between the first impurity semiconductor layer 105, the second impurity semiconductor layer 106, and the wide band-gap layer 116a, which are formed in the semiconductor layer 102. Distribution of an n-type impurity element in the second impurity semiconductor layer 106 is denoted by a dashed line and distribution of hydrogen or halogen such as fluorine included in the wide band-gap layer 116a is denoted by a long dashed short dashed line. The wide band-gap layer 116a is a region including both an n-type impurity element and hydrogen or halogen such as fluorine. The concentration of hydrogen or halogen such as fluorine becomes higher towards the surface of the semiconductor substrate 101.

Figure 10:
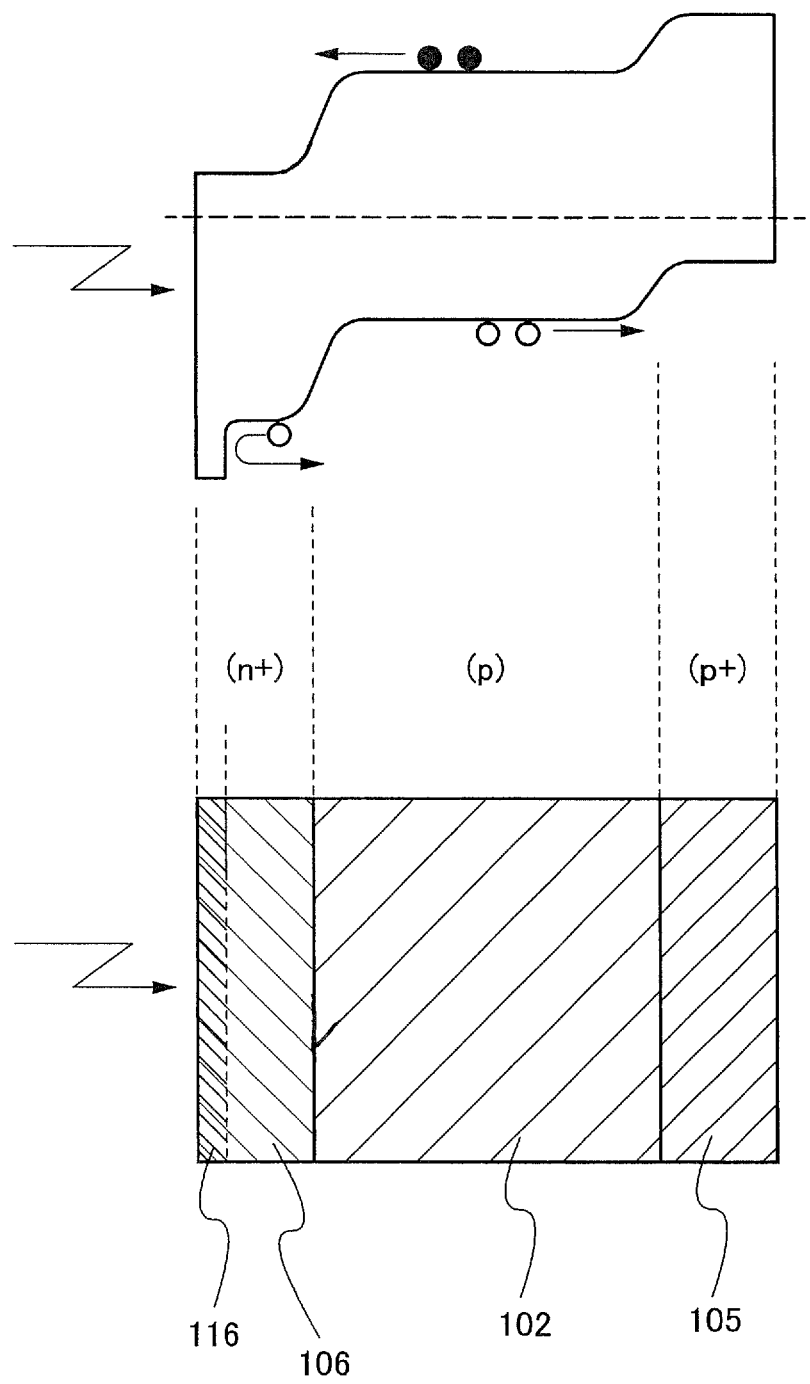
FIG. 10 is a diagram illustrating a structure in FIG. 9 using a band model.

FIG. 10 is a diagram which illustrates the state using a band model. According to this embodiment mode, as is shown in FIG. 10, an energy gap of the wide band-gap layer 116 is wider than that of a center portion of the semiconductor layer 102. Therefore, more light can be taken in the semiconductor layer 102 when a light incidence surface is on the wide band-gap layer 116 side. Further, the wide band-gap layer 116 serves as a hole blocking layer which prevents holes which are generated in or near the second impurity semiconductor layer 106 from flowing into the wide band-gap layer 116, being absorbed by an electrode, and being disappeared. Accordingly, collection efficiency of photogenerated carriers, that is, external quantum efficiency can be increased. In addition, built-in potential (a built-in electric field) can be heightened by adding the wide band-gap layer 116 to a semiconductor junction formed by the semiconductor layer 102, the first impurity semiconductor layer 105, and the second impurity semiconductor layer 106t. When the bonding layer 103 and the substrate 101 face each other, the first impurity semiconductor layer 105 is placed in a region in the semiconductor layer 102 on the substrate 101 side.

Figure 8C:
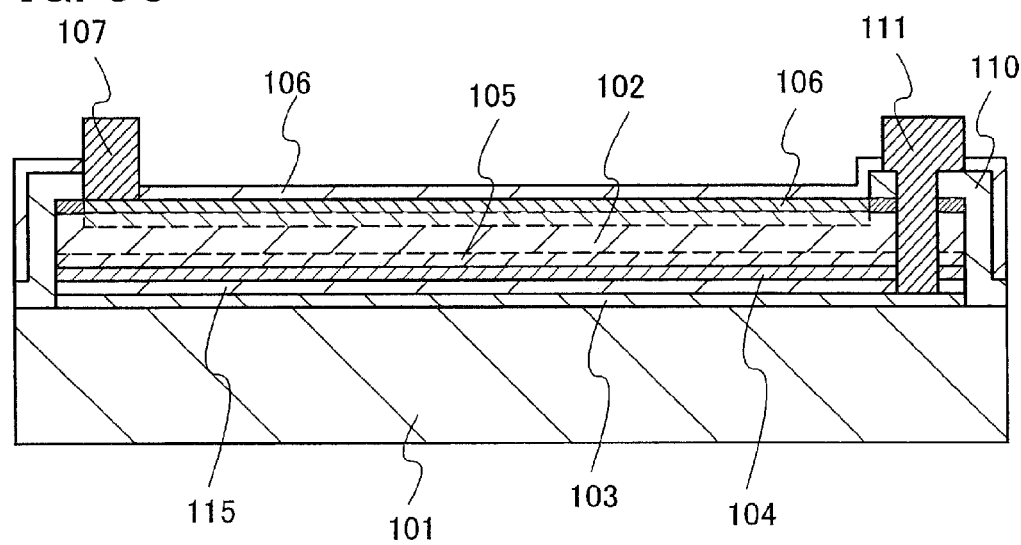

FIG. 8C shows a step in which the second electrode 107 and an extraction electrode 111 which is connected to the first electrode 104 are formed. The extraction electrode 111 is formed after a contact hole penetrating the semiconductor layer 102 is formed. The second electrode 107 and the extraction electrode 111 may be formed from aluminum, silver, lead-tin (solder), or the like. For example, the second electrode 107 and the extraction electrode 111 can be formed using a silver paste by a screen printing method.

In an above-described manner, the photovoltaic device shown in FIG. 4 can be manufactured. According to this embodiment mode, a single crystal photovoltaic device can be manufactured at a process temperature equal to or lower than 700° C. (preferably, equal to or lower than 500° C.). In other words, a high-efficiency photovoltaic device including a single crystal semiconductor layer can be manufactured over a large-area glass substrate with an upper temperature limit of 700° C. or less. The single crystal semiconductor layer is obtained by separation of an outer layer of a single crystal semiconductor substrate. Since the single crystal semiconductor substrate can be repeatedly used, resources can be effectively used. Further, by providing an impurity semiconductor layer to which hydrogen or halogen is added on the light incidence surface side or the opposite side thereto, collection efficiency of photogenerated carriers can be improved and photoelectric conversion characteristics can be increased.

Embodiment Mode 2

This embodiment mode describes an example of a method for providing a single crystal semiconductor layer over a large-area substrate and manufacturing a photovoltaic device module. Manufacturing steps of a photovoltaic device is similar to those illustrated in FIGS. 5A to 8C.

Figure 11:
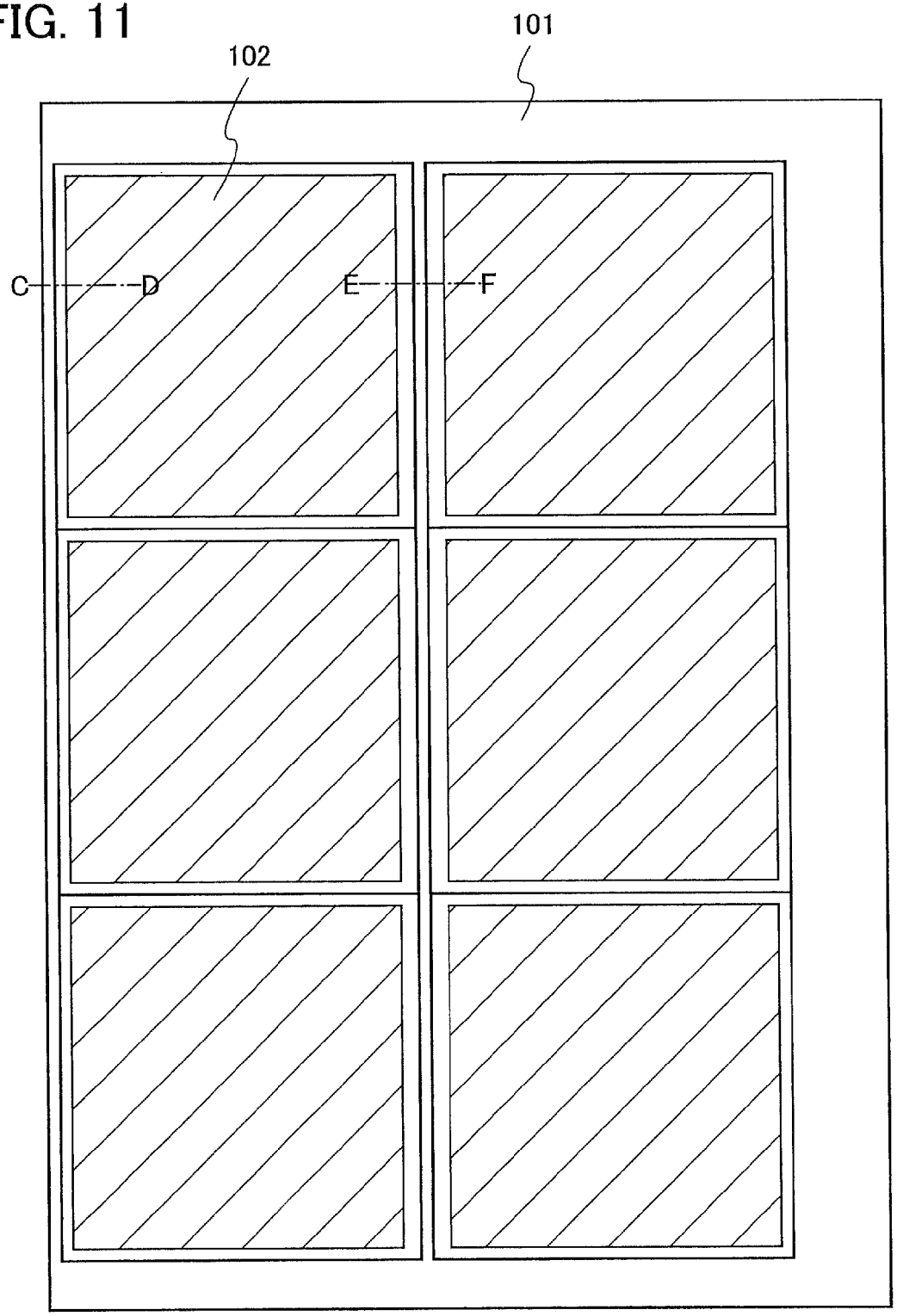
FIG. 11 is a plan view illustrating a manufacturing step of a photovoltaic device module relating to an embodiment mode.
Figure 12A:
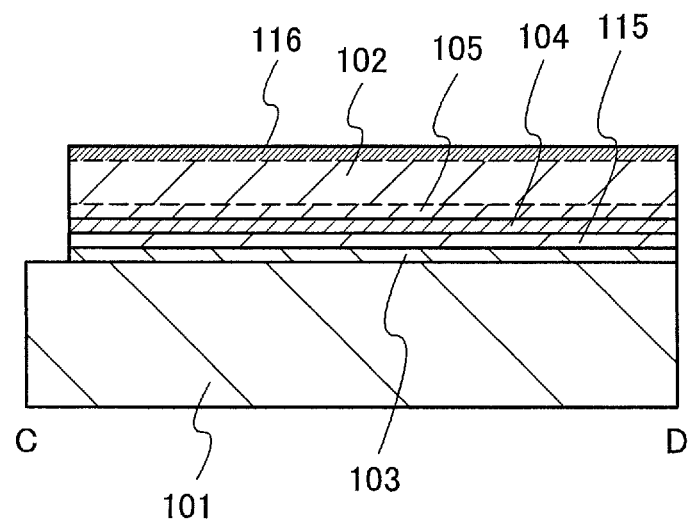
FIGS. 12A and 12B are cross-sectional views illustrating a manufacturing step of a photovoltaic device module relating to an embodiment mode.
Figure 12B:
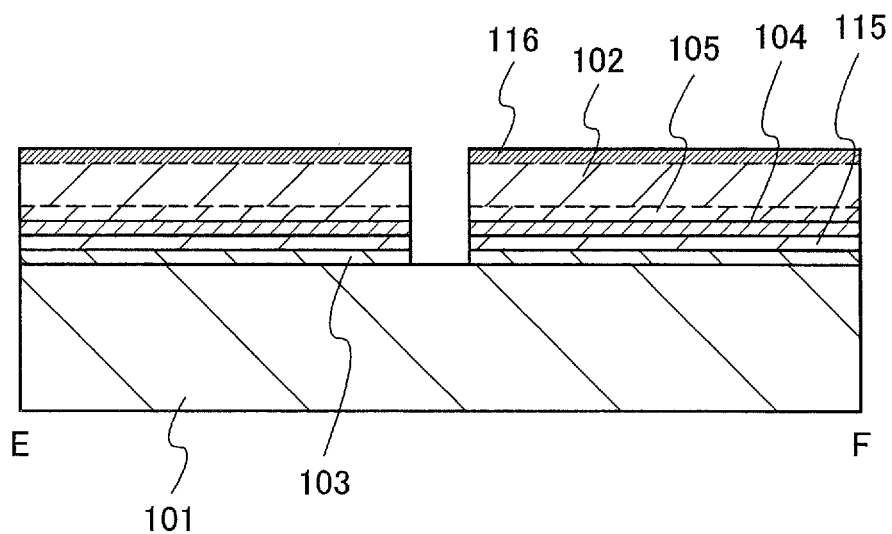

The single crystal semiconductor substrate 112 which is manufactured through the steps in FIGS. 5A to 5D is bonded to the substrate 101. Here, a substrate having an area to which a plurality of the single crystal semiconductor substrates 112 can be bonded is used as the substrate 101. The single crystal semiconductor substrate 112 is fixed to the substrate 101 with the bonding layer 103. A plurality of the single crystal semiconductor substrates 112 are fixed to the substrate 101, and then thermal treatment may be performed thereon to form a bond. When the single crystal semiconductor substrates 112 are separated, the semiconductor layer 102 is disposed over the substrate 101. FIG. 11 shows a state in which a plurality of the semiconductor layers 102 are bonded to the substrate 101. FIGS. 12A and 12B are cross-sectional views taken along line C-D and line E-F in FIG. 11, respectively. The semiconductor layers 102 may be arranged with a certain distance between neighboring semiconductor layers 102. In the following steps, the substrate 101 which is provided with a plurality of semiconductor layers 102 can be treated as one unit to carry out the steps.

Steps shown in FIGS. 8A and 8B are carried out to form the second impurity semiconductor layer 106 in the semiconductor layer 102. After the insulating layer 110 is formed over the semiconductor layer 102, an opening is formed in the insulating layer 110. Then, the second impurity semiconductor layer 106 is formed. Since the second impurity semiconductor layer 106 can be formed with an ion doping apparatus, the processing time can be reduced compared to a case in which the crystal semiconductor substrates are treated one by one. Then, the protection film 108 is formed.

Figure 13:
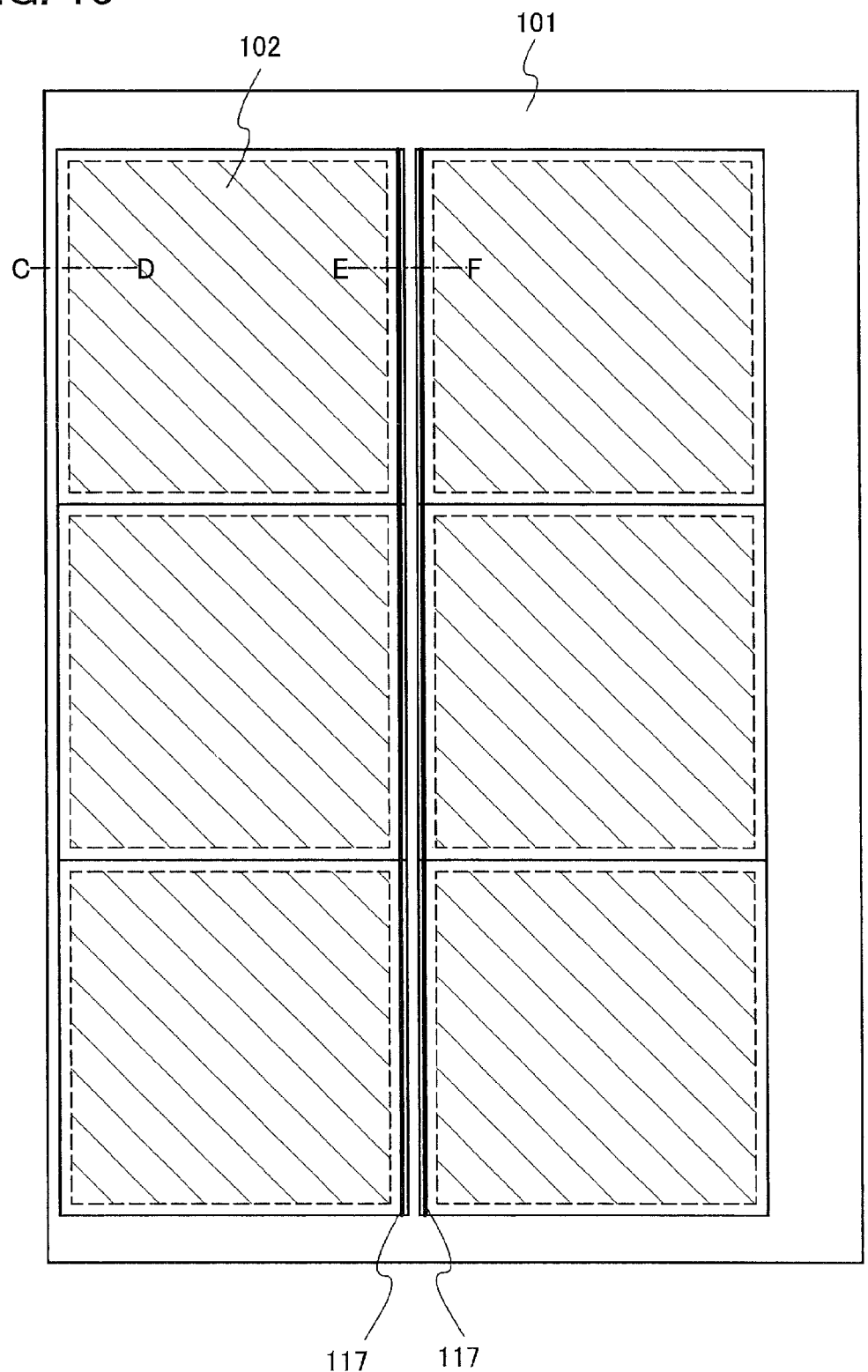
FIG. 13 is a plan view illustrating a manufacturing step of a photovoltaic device module relating to an embodiment mode.
Figure 14A:
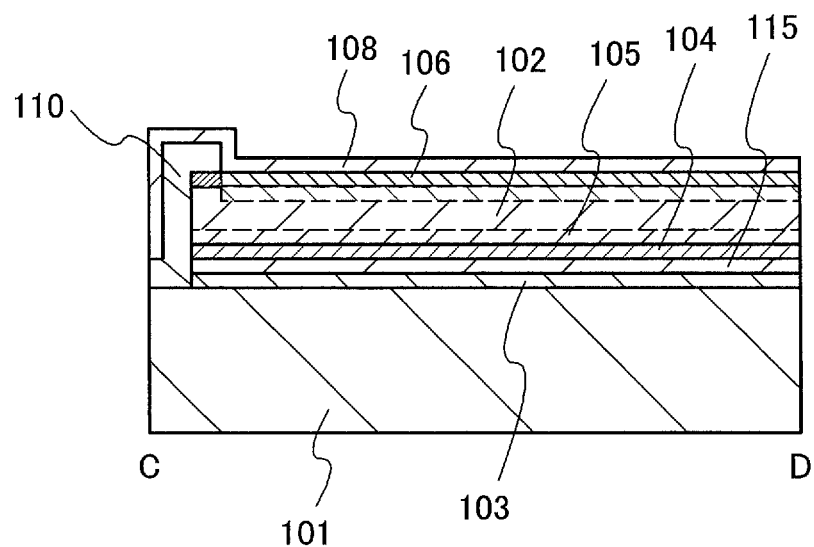
FIGS. 14A and 14B are cross-sectional views illustrating a manufacturing step of a photovoltaic device module relating to an embodiment mode.
Figure 14B:
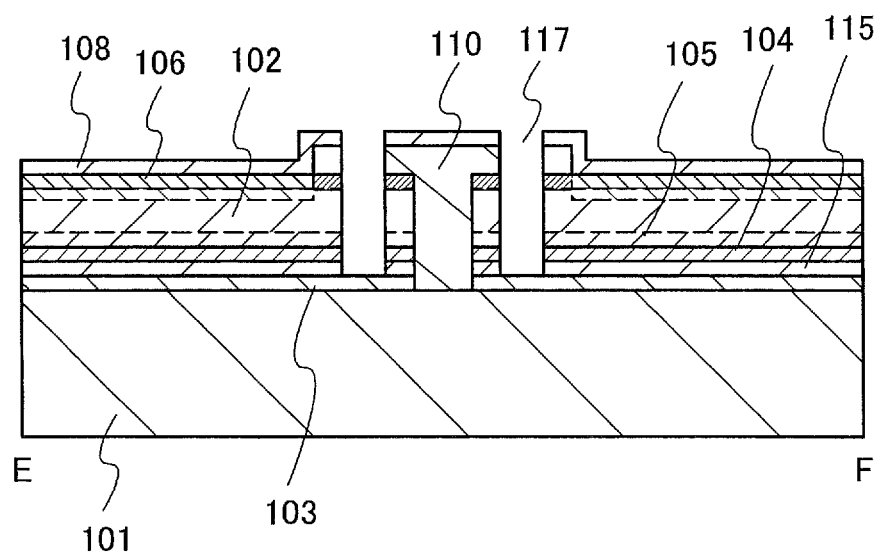

FIG. 13 shows a step of forming a contact hole 117 which is connected to the first electrode 104. FIGS. 14A and 14B are cross-sectional views taken along line C-D and line E-F in FIG. 13, respectively. The contact hole 117 is formed open to the protection film 108 side. The contact hole 117 is formed by irradiating the semiconductor layer 102 with a laser beam which is condensed and the semiconductor layer 102 is removed to expose a surface or a side surface of the first electrode 104. Since the laser beam may scan across the substrate 101, even in the case of providing a plurality of semiconductor layers 102, time required for forming the contact holes 117 can be short.

Figure 15:
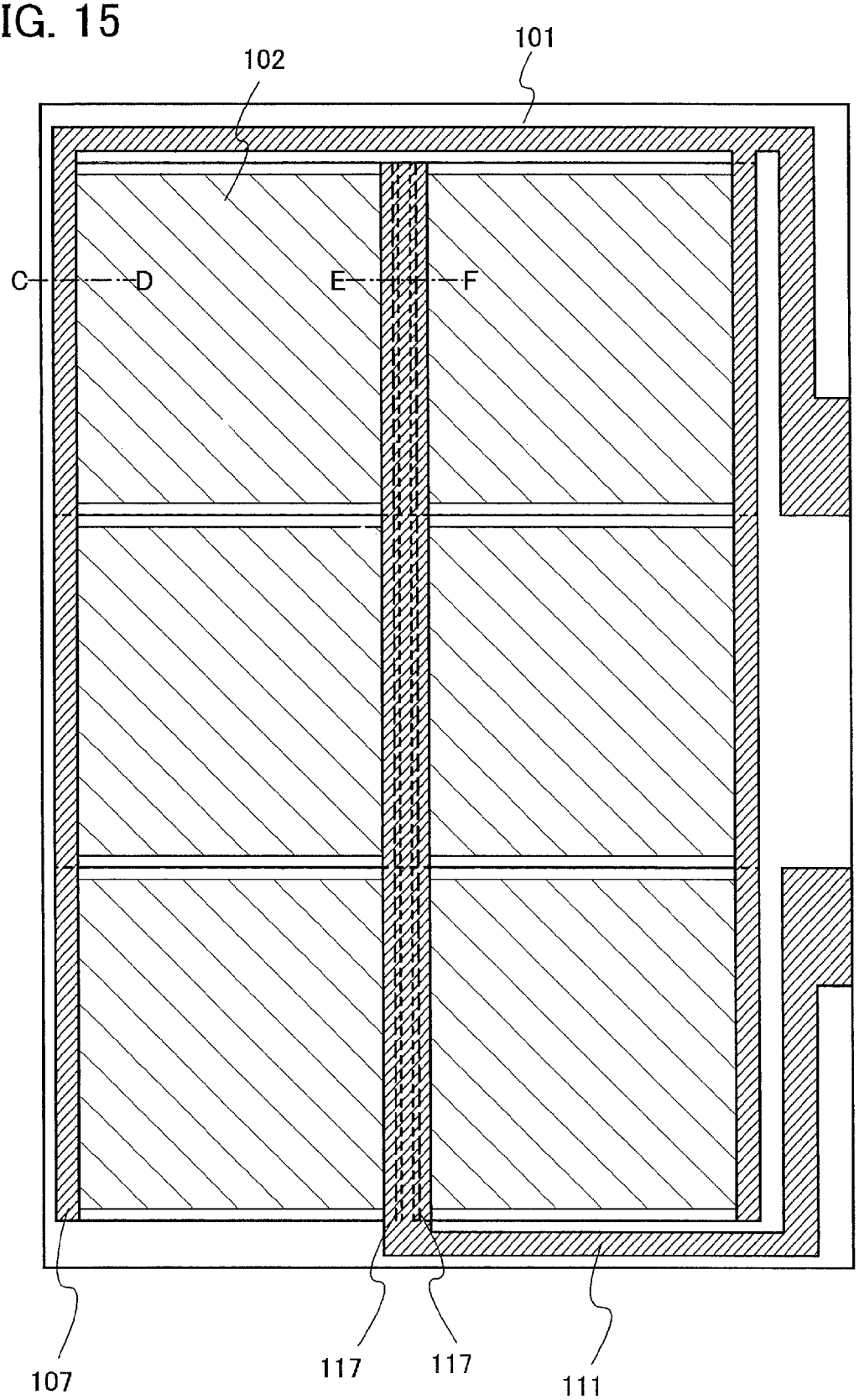
FIG. 15 is a plan view illustrating a manufacturing step of a photovoltaic device module relating to an embodiment mode.
Figure 16A:
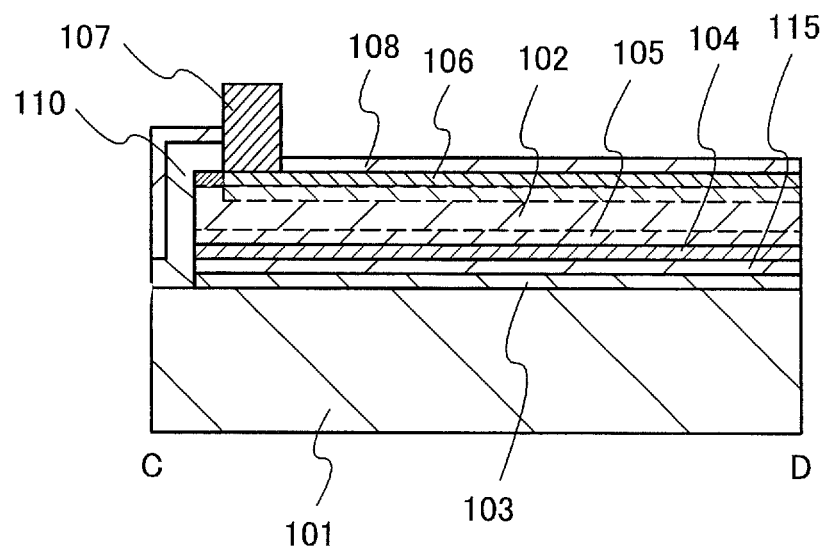
FIGS. 16A and 16B are cross-sectional views illustrating a manufacturing step of a photovoltaic device module relating to an embodiment mode.
Figure 16B:
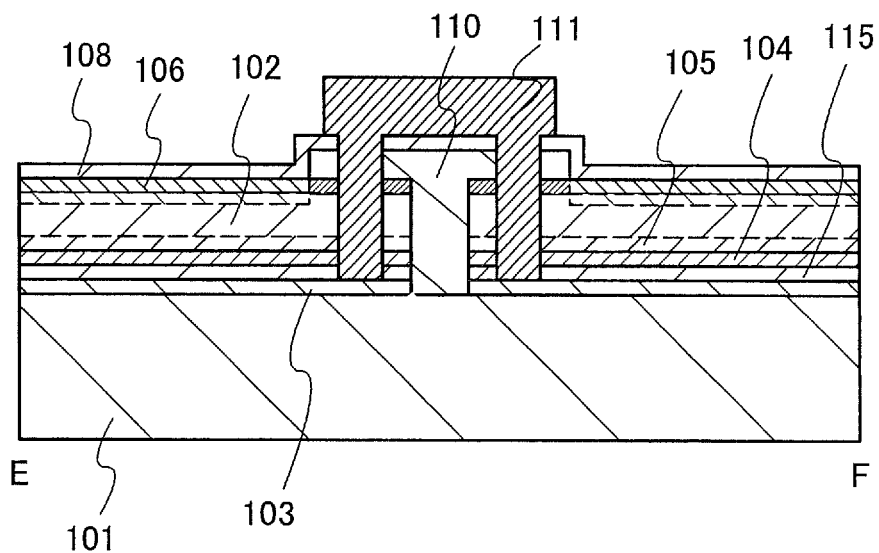

After that, the extraction electrode 111 of the first electrode 104 and the second electrode 107 are formed as shown in FIG. 15. FIGS. 16A and 16B are cross-sectional views taken along line C-D and line E-F in FIG. 15, respectively. When the extraction electrode 111 is formed to fill the contact hole 117, the extraction electrode 111 can be connected to the first electrode 104. The second electrode 107 and the extraction electrode 111 may be formed of aluminium, silver, lead-tin (solder), or the like. For example, the second electrode 107 and the extraction electrode 111 can be faulted using a silver paste by a screen printing method. In the case of leading the second electrode 107 and the extraction electrode 111 over the substrate 101, a connection terminal can be formed.

In an above-described manner, a photovoltaic device module in which a plurality of photovoltaic devices are arranged over one substrate can be manufactured. According to this embodiment mode, a single crystal photovoltaic device can be manufactured at a process temperature equal to or lower than 700° C. (preferably, equal to or lower than 500° C.). In other words, a high-efficiency photovoltaic device module including a single crystal semiconductor layer can be manufactured over a large-area glass substrate with an upper temperature limit of 700° C. or less.

Embodiment Mode 3

This embodiment mode describes manufacturing steps for manufacturing a photovoltaic device as described in Embodiment Mode 1, by reusing the single crystal semiconductor substrate 112 from which the semiconductor layer 102 has been taken out.

Figure 17A:
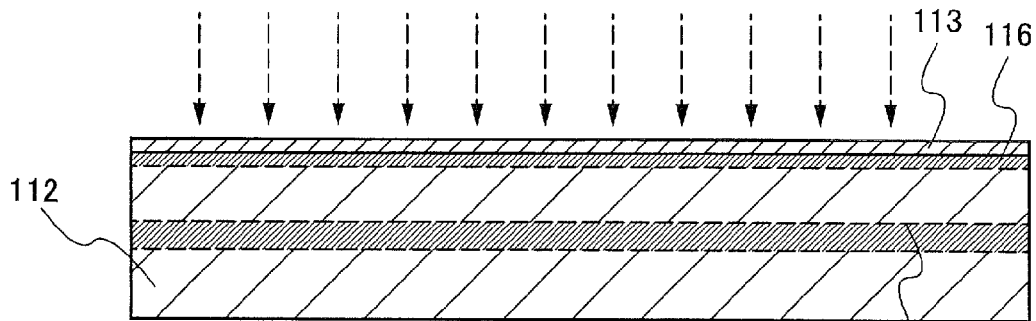
FIGS. 17A to 17D are cross-sectional views illustrating manufacturing steps of a photovoltaic device relating to an embodiment mode.

FIG. 17A shows a step in which the surface protection film 113 is formed over the single crystal semiconductor substrate 112 which has been used for forming the semiconductor layer 102 in Embodiment Mode 1, and the separation layer 114 is formed by introducing ions of hydrogen or halogen typified by fluorine. Ions of a rare gas such as helium, argon, or krypton may be added to the separation layer 114. The wide band-gap layer 116 remains on a surface side in the single crystal semiconductor substrate 112. The wide band-gap layer 116 is a layer which has been formed as a separation layer in a previous process and which includes hydrogen or halogen which remains in this process. In this process, a surface of the single crystal semiconductor substrate 112 is preferably planarized with a treatment such as CMP.

Figure 17B:
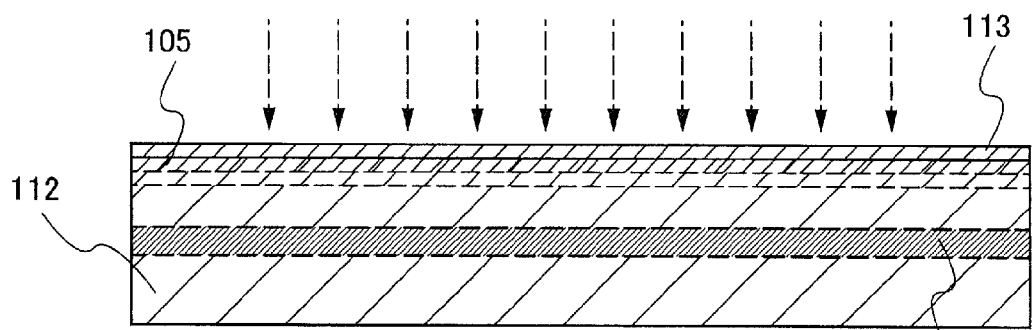

Then, as shown in FIG. 17B, the first impurity semiconductor layer 105 is formed by doping a thin region on the surface in the single crystal semiconductor substrate 112 with boron as an impurity element imparting p-type conductivity. The first impurity semiconductor layer 105 is formed to include the wide band-gap layer 116. It is possible that the first impurity semiconductor layer 105 be formed to include the wide band-gap layer 116 as the entire part. Further, the first impurity semiconductor layer 105 may be formed deeper than the wide band-gap layer 116.

Figure 18:
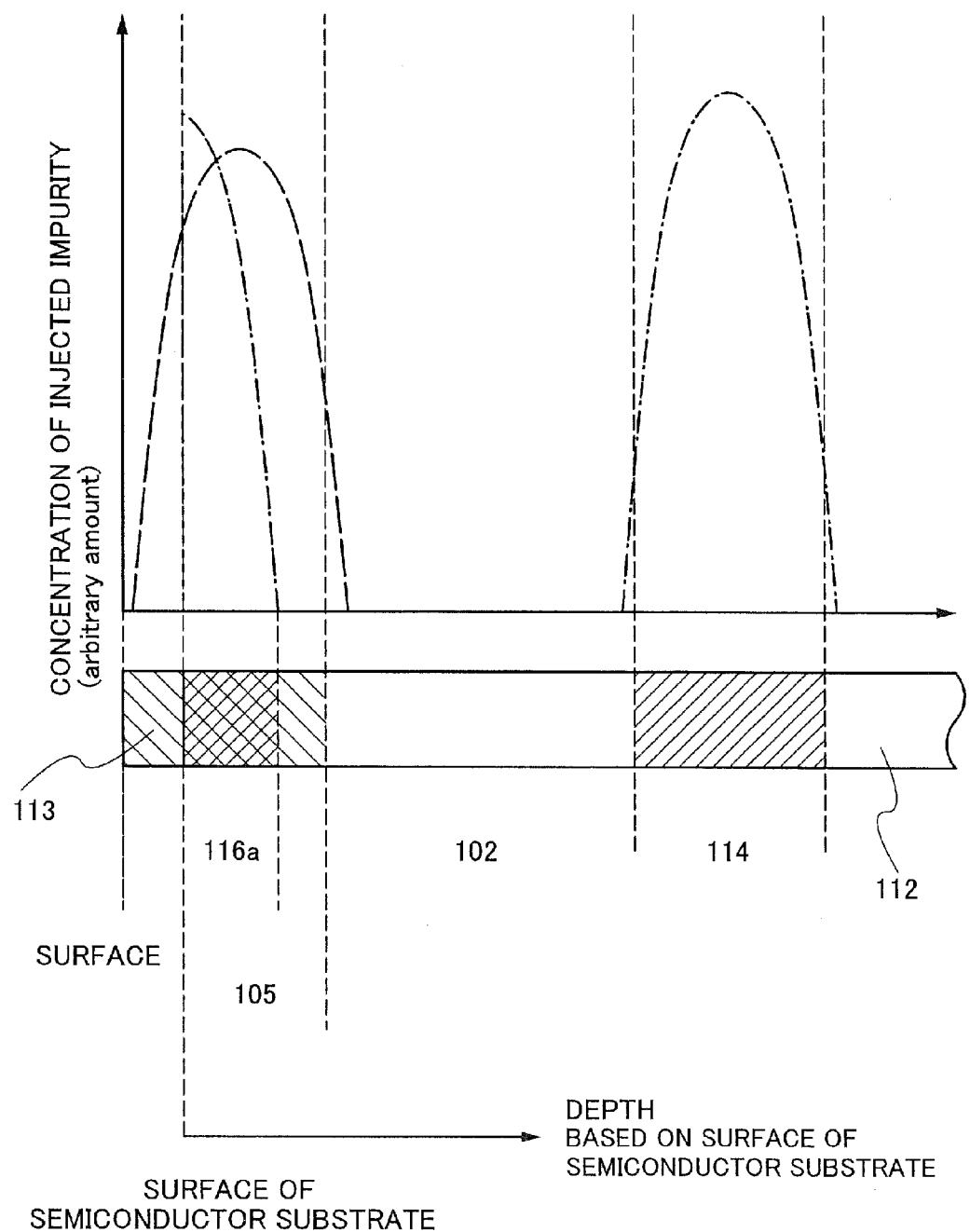
FIG. 18 is a graph illustrating an impurity distribution in a separation layer and a first impurity semiconductor layer which are formed in a single crystal semiconductor substrate.

FIG. 18 is a graph showing a relation between the separation layer 114, the first impurity semiconductor layer 105, and the wide band-gap layer 116a, which are formed in the single crystal semiconductor substrate 112. The separation layer 114 is formed at a long distance from the surface of the single crystal semiconductor substrate 112. Distribution of a p-type impurity element in the first impurity semiconductor layer 105 is denoted by a dashed line and distribution of hydrogen or halogen such as fluorine in the wide band-gap layer 116a is denoted by a long dashed short dashed line. The wide band-gap layer 116a is a region including both a p-type impurity element and hydrogen or halogen such as fluorine. The concentration of hydrogen or halogen such as fluorine becomes higher towards the surface of the semiconductor substrate. The first impurity semiconductor layer 105 is disposed on the side opposite to the light incidence side to form a back surface field (BSF).

Figure 17C:
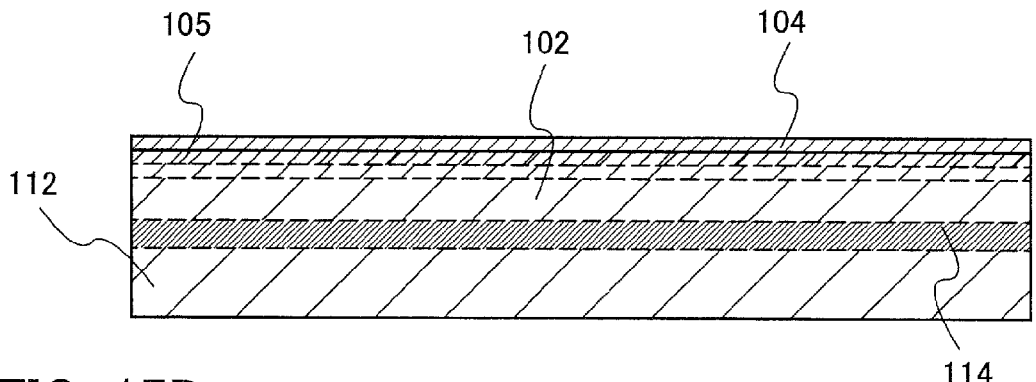

FIG. 17C shows a step of forming the first electrode 104 over the first impurity semiconductor layer 105. The first electrode 104 is formed of a metal such as aluminium, nickel, or silver. The first electrode 104 is formed by a vacuum deposition method or a sputtering method to have a planarized surface.

Figure 17D:
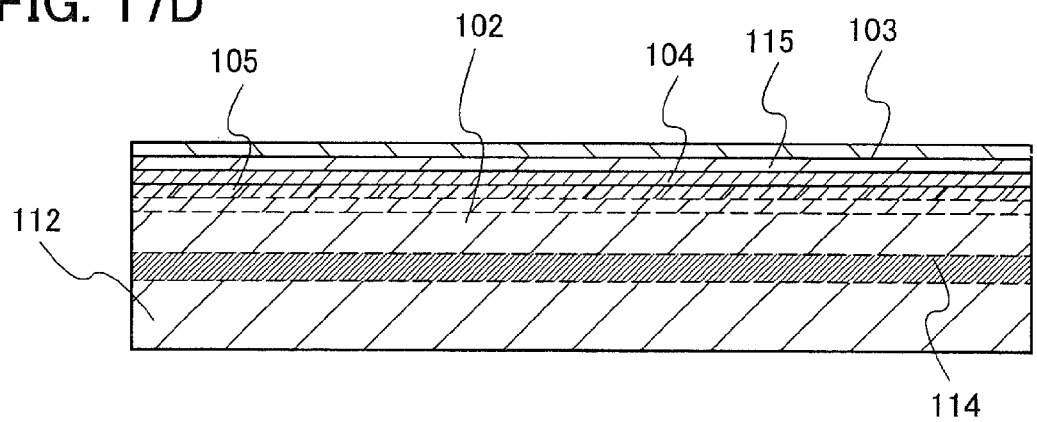

FIG. 17D shows a step in which the protection film 115 is formed over the first electrode 104 to cover the single crystal semiconductor substrate 112 and the bonding layer 103 is further formed. The bonding layer 103 is preferably formed of a silicon oxide film. As a silicon oxide film, a silicon oxide film which is formed using an organic silane gas by a chemical vapor deposition method is preferably used as described above. Alternatively, a silicon oxide film which is formed using a silane gas by a chemical vapor deposition method can be used.

Then, the semiconductor layer 102 is bonded to the substrate 101 similarly to Embodiment Mode 1. FIG. 19A shows a step in which the insulating layer 110 is formed over the semiconductor layer 102 which is bonded to the substrate 101. As the insulating layer 110, a silicon nitride film or a silicon oxide film is preferably formed by a chemical vapor deposition method. The wide band-gap layer 116 which includes hydrogen or halogen such as fluorine introduced in order to form the separation layer 114 is left on the surface side in the semiconductor layer 102. The wide band-gap layer 116 is a layer in which an energy gap is larger than 1.12 eV, which is an energy gap of silicon, because the wide band-gap layer 116 includes hydrogen or halogen in silicon of the single crystal semiconductor substrate 112.

FIG. 19B shows a step in which an opening is formed in the insulating layer 110 and phosphorus or arsenic, which is an n-type impurity element, is added through the opening to form the second impurity semiconductor layer 106. The second impurity semiconductor layer 106 is used as a light incidence surface. In this case, the second impurity semiconductor layer 106 is formed to include the wide band-gap layer 116. It is possible that the second impurity semiconductor layer 106 be formed to include the wide band-gap layer 116 as the entire part. Further, the second impurity semiconductor layer 106 may be formed deeper than the wide band-gap layer 116. In this case, hydrogen in the wide band-gap layer 116 can be prevented from being released by forming a silicon nitride film as the protection film 108 on the surface of the semiconductor layer 102 and introducing an n-type impurity element such as phosphorus or arsenic.

Figure 20:
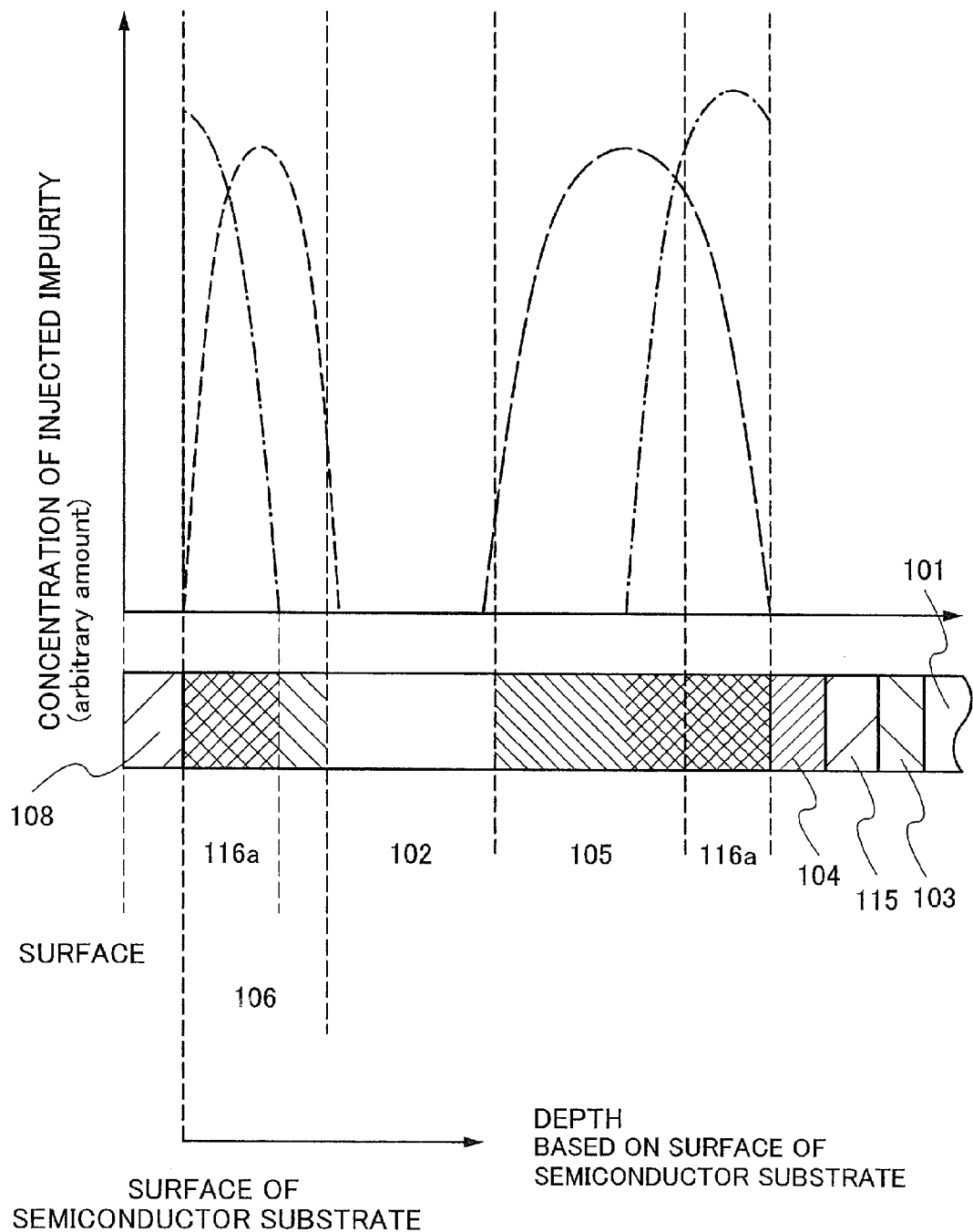
FIG. 20 is a graph illustrating a relation of a first impurity semiconductor layer, a second impurity semiconductor layer, and a wide band-gap layer which are formed in a semiconductor layer.

FIG. 20 is a graph showing a relation between the first impurity semiconductor layer 105, the second impurity semiconductor layer 106, and the wide band-gap layer 116a, which are formed in the semiconductor layer 102. The wide band-gap layers 116a are formed on the opposite sides to the semiconductor layer 102. In FIG. 20, distribution of a p-type impurity element in the first impurity semiconductor layer 105 and an n-type impurity element in the second impurity semiconductor layer 106 is denoted by a dashed line and distribution of hydrogen or halogen such as fluorine in the in wide band-gap layer 116a is denoted by a long dashed short dashed line. The wide band-gap layer 116a is a region including an n-type or p-type impurity element as well as hydrogen or halogen such as fluorine.

Figure 21:
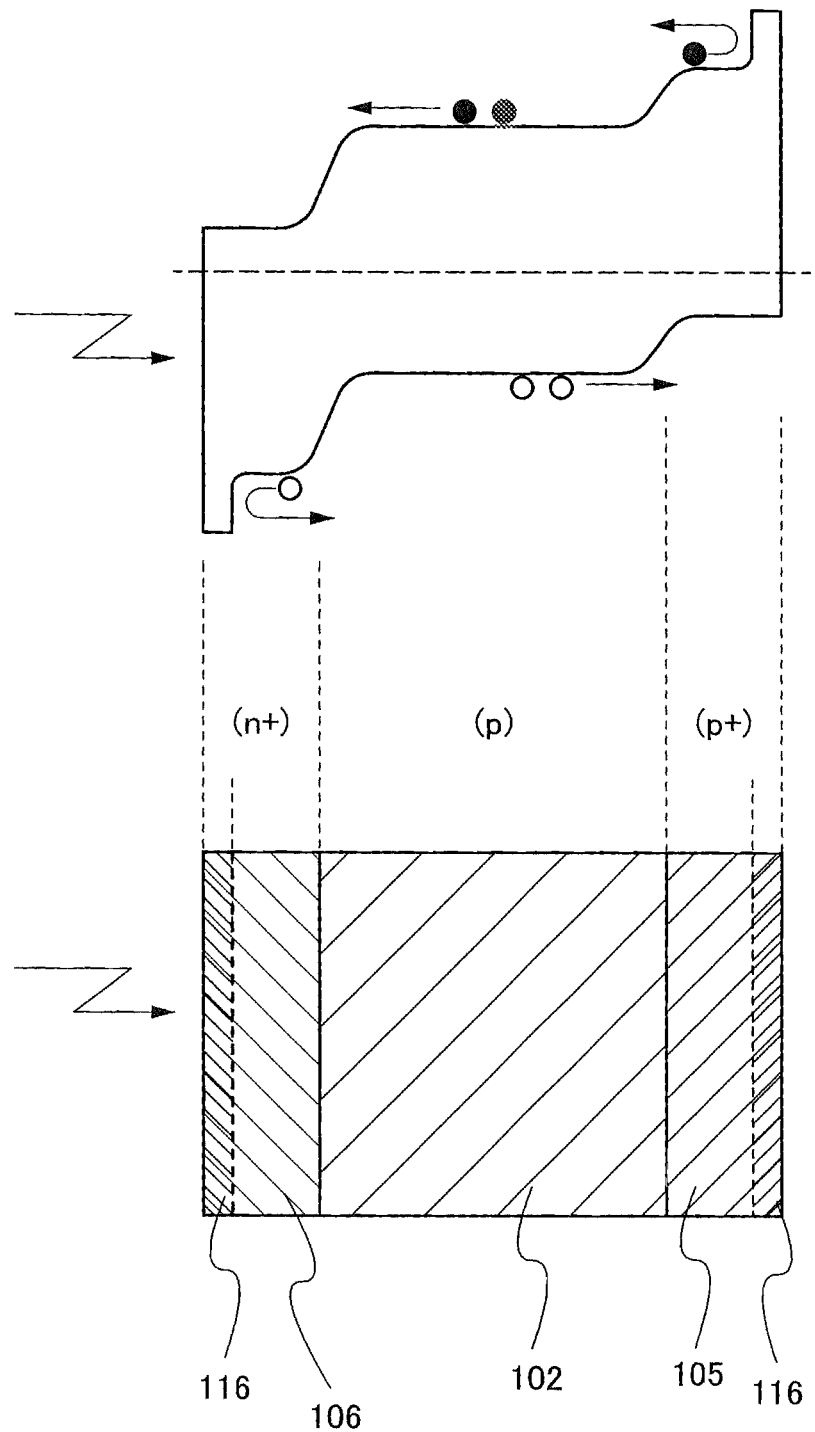
FIG. 21 is a diagram illustrating a structure in FIG. 20 using a band model.

FIG. 21 is a diagram which illustrates the state using a band model. According to this embodiment mode, as is shown in FIG. 21, energy gaps of the first impurity semiconductor layer 105 and the wide band-gap layer 116, which is in an outer part of the second impurity semiconductor layer 106, are wider than that of a center portion of the semiconductor layer 102. Therefore, more light can be taken in the semiconductor layer 102 when a light incidence surface is on the wide band-gap layer 116 on the second impurity semiconductor layer 106 side. Further, the wide band-gap layer 116 on the second impurity semiconductor layer 106 side serves as a hole blocking layer which prevents holes which are generated in or near the second impurity semiconductor layer 106 from flowing into the wide band-gap layer 116, being absorbed by an electrode, and being disappeared. In addition, the wide band-gap layer 116 on the first impurity semiconductor layer 105 side has a function of blocking layer for electrons. According to this structure, blocking layers of the wide band-gap layers 116 for electrons and holes are formed on surfaces of the first impurity semiconductor layer 105 and the second impurity semiconductor layer 106, so that photogenerated carriers can be prevented from diffusing in the reverse direction and from being absorbed by electrodes. Accordingly, collection efficiency of photogenerated carriers, that is, external quantum efficiency can be increased.

FIG. 19C shows a step in which the second electrode 107 and an extraction electrode 111 which is connected to the first electrode 104 are formed. The extraction electrode 111 is formed after a contact hole penetrating the semiconductor layer 102 is formed. The second electrode 107 and the extraction electrode 111 may be formed from aluminum, silver, lead-tin (solder), or the like. For example, the second electrode 107 and the extraction electrode 111 can be formed using a silver paste by a screen printing method.

In an above-described manner, a photovoltaic device can be manufactured. According to this embodiment mode, a single crystal photovoltaic device can be manufactured at a process temperature equal to or lower than 700° C. (preferably, equal to or lower than 500° C.). In other words, a photovoltaic device in which a single crystal semiconductor layer is disposed over a large-area glass substrate with an upper temperature limit of 700° C. or less can be manufactured. The single crystal semiconductor layer is obtained by separation of an outer layer of a single crystal semiconductor substrate. Since the single crystal semiconductor substrate can be used repeatedly, resources can be effectively used. Further, by providing an impurity semiconductor layer with a wider band gap to which hydrogen or halogen is added on both the light incidence surface side and the opposite side thereto of the semiconductor layer 102, collection efficiency of photogenerated carriers is improved and photoelectric conversion characteristics can be increased.

This application is based on Japanese Patent Application serial no. 2007-106591 filed with Japan Patent Office on Apr. 13, 2007, the entire contents of which are hereby incorporated by reference.

EXPLANATION OF REFERENCE

101: substrate, 102: semiconductor layer, 103: bonding layer, 104: first electrode, 105: first impurity semiconductor layer, 105a wide band-gap layer, 106: second impurity semiconductor layer, 106a: wide band-gap layer, 107: second electrode, 108: protection film, 109: barrier layer, 110: insulating layer, 111: extraction electrode, 112: single crystal semiconductor substrate, 113: surface protection film, 114: separation layer, 115: protection film, 116: wide band-gap layer, 116a: wide band-gap layer, 117: contact hole.

What is claimed is:

1. A method for manufacturing a photovoltaic device, comprising the steps of:
preparing a single crystal semiconductor substrate comprising a first region, a second region adjacent to the first region, and a third region between the first region and the second region;
injecting hydrogen or halogen into the first region and the third region;
forming a silicon oxide film on and in contact with the second region after the step of injecting, by a chemical vapor deposition method using an organic silane gas;
bonding a substrate having an insulating surface and the silicon oxide film, by close contacting the insulating surface with the silicon oxide film;
separating the first region and the third region, after the step of bonding; and
adding an impurity element to the third region, after the step of separating.

2. The method for manufacturing a photovoltaic device, according to claim 1,
wherein the hydrogen or halogen is doped by injecting ions generated by plasma excitation using a gas of hydrogen or halogen.

3. The method for manufacturing a photovoltaic device, according to claim 2,
wherein the ions are $H^+$, $H_2^+$, and $H_3^+$, with a high proportion of $H_3^+$.

4. The method for manufacturing a photovoltaic device, according to claim 1,
wherein the organic silane gas is selected from a group consisting of tetraethoxysilane, trimethylsilane, tetramethylcyclotetrasiloxane, octamethylcyclotetrasiloxane, hexamethyldisilazane, triethoxysilane, and trisdimethylaminosilane.

5. The method for manufacturing a photovoltaic device, according to claim 1,
wherein the first region and the third region are separated by generating cleavage between the first region and the third region, by performing a thermal treatment.

6. The method for manufacturing a photovoltaic device, according to claim 5,
wherein the injected hydrogen or halogen is not released in the step of forming the silicon oxide film, and
wherein the injected hydrogen or halogen is released in the thermal treatment.

7. The method for manufacturing a photovoltaic device, according to claim 5,
wherein the step of forming the silicon oxide film is performed at equal to or lower than 350° C., and
wherein the thermal treatment is performed at equal to or higher than 400° C.

8. A method for manufacturing a photovoltaic device, comprising the steps of:
preparing a single crystal semiconductor substrate comprising a first region, a second region adjacent to the first region, a third region between the first region and the second region, and a fourth region between the second region and the third region;
injecting hydrogen or halogen into the first region, the third region and the second region;
adding a first impurity element to the second region, after the step of injecting;
forming a silicon oxide film on and in contact with the second region after the step of adding, by a chemical vapor deposition method using an organic silane gas;
bonding a substrate having an insulating surface and the silicon oxide film, by close contacting the insulating surface with the silicon oxide film;
separating the first region and the third region, after the step of bonding; and
adding a second impurity element to the third region, after the step of separating,
wherein a first conductivity type of the first impurity element is different from a second conductivity type of the second impurity element.

9. The method for manufacturing a photovoltaic device, according to claim 8,
wherein the hydrogen or halogen is doped by injecting ions generated by plasma excitation using a gas of hydrogen or halogen.

10. The method for manufacturing a photovoltaic device, according to claim 9,
wherein the ions are $H^+$, $H_2^+$, and $H_3^+$, with a high proportion of $H_3^+$.

11. The method for manufacturing a photovoltaic device, according to claim 8,
wherein the organic silane gas is selected from a group consisting of tetraethoxysilane, trimethylsilane, tetramethylcyclotetrasiloxane, octamethylcyclotetrasiloxane, hexamethyldisilazane, triethoxysilane, and trisdimethylaminosilane.

12. The method for manufacturing a photovoltaic device, according to claim 8,
wherein the first region and the third region are separated by generating cleavage between the first region and the third region, by performing a thermal treatment.

13. The method for manufacturing a photovoltaic device, according to claim 12, wherein the injected hydrogen or halogen is not released in the step of forming the silicon oxide film, and wherein the injected hydrogen or halogen is released in the thermal treatment.

14. The method for manufacturing a photovoltaic device, according to claim 12, wherein the step of forming the silicon oxide film is performed at equal to or lower than 350° C., and wherein the thermal treatment is performed at equal to or higher than 400° C.

* * * * *